United States Patent [19]
Bakhmutsky

[11] Patent Number: 5,990,812
[45] Date of Patent: Nov. 23, 1999

[54] UNIVERSALLY PROGRAMMABLE VARIABLE LENGTH DECODER

[75] Inventor: Michael Bakhmutsky, Spring Valley, N.Y.

[73] Assignee: Philips Electronics North America Corporation, New York, N.Y.

[21] Appl. No.: 08/958,091

[22] Filed: Oct. 27, 1997

[51] Int. Cl.[6] .................................................. H03M 7/40
[52] U.S. Cl. ............................................. 341/67; 341/106
[58] Field of Search ................................. 341/67, 68, 65, 341/94, 95, 106, 107

[56] References Cited

U.S. PATENT DOCUMENTS

| 5,173,695 | 12/1992 | Sun et al. | 341/67 |
| 5,600,812 | 2/1997 | Park | 711/200 |
| 5,650,905 | 7/1997 | Bakhmutsky | 341/67 |
| 5,675,332 | 10/1997 | Limberg | 341/67 |

OTHER PUBLICATIONS

U.S. Patent Application Serial No. 08/671,891, filed Jun. 28, 1996.
U.S. Patent Application Serial No. 08/580,404, filed Dec. 28, 1995.

Primary Examiner—Brian Young
Attorney, Agent, or Firm—Laurie E. Gathman

[57] ABSTRACT

A variable length decoder for decoding an input digital data stream which includes a plurality of variable length code words which are coded in accordance with any of a plurality of different coding standards. The variable length decoder includes an input circuit which receives the input digital data stream and produces a decoding window that includes a leading word aligned bit stream, and a decoding circuit which is configurable into any selected one of a plurality of different decoding configurations, depending upon which coding standard the input digital data stream is coded in accordance with, the decoding circuit being coupled to the leading word aligned bit stream for decoding the length and value of each code word in the input digital data stream. The variable length decoder further includes a programmable controller for controlling the operation of the variable length decoder in accordance with any of a plurality of different decoding protocols, depending upon the coding standard employed in coding the input digital data stream. The programmable controller determines which coding standard was employed in coding the input digital data stream, and then automatically configures the decoding circuit into the decoding configuration which is appropriate for decoding the input digital data stream, based upon this determination. The variable length decoder also includes a code word value memory which is used for decoding the values of the code words in the input digital data stream.

53 Claims, 34 Drawing Sheets

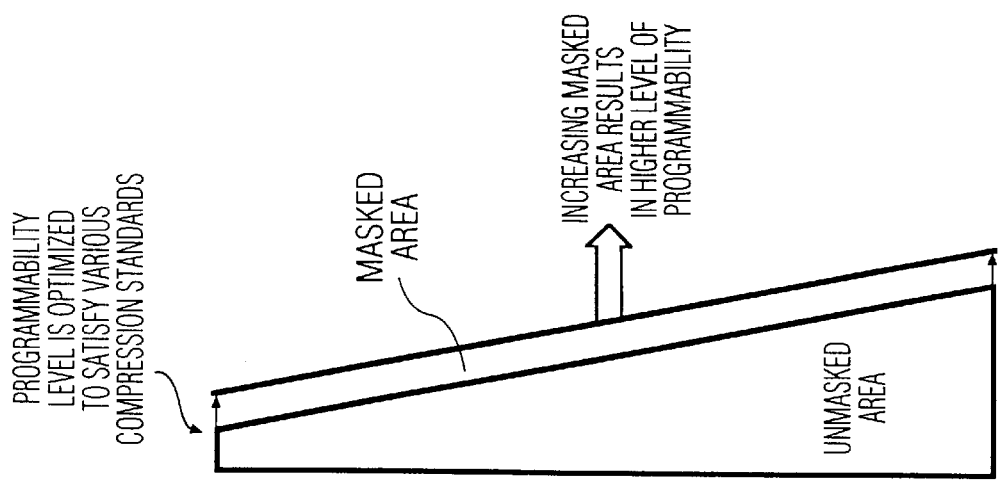
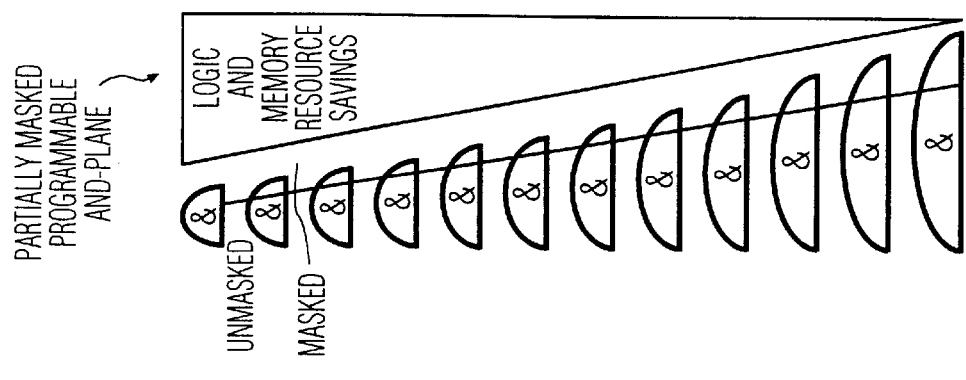
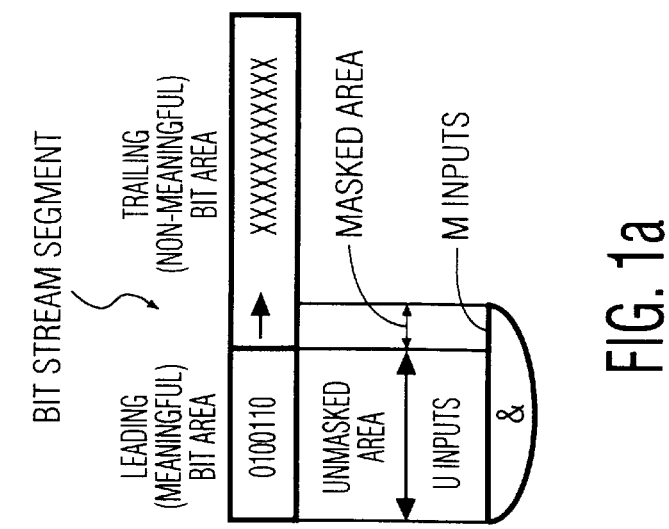

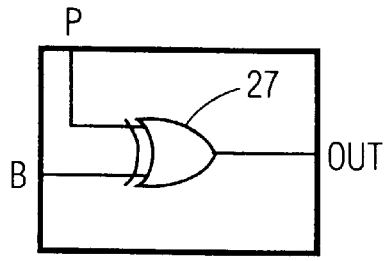
CELL TYPE 1
PROGRAMMABLE INVERTER
FIG. 3a
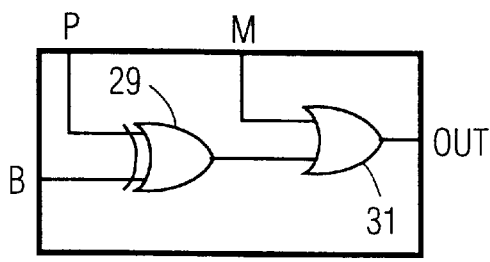
CELL TYPE 2
PROGRAMMABLE INVERTER
WITH MASK
FIG. 3b
FIND SUB-TREE
| M5 | M6 | ST4 | ST3 | ST2 | ST1 | ST0 |
|----|----|-----|-----|-----|-----|-----|
| 1  | 1  | B5  | B6  | B7  | B8  | B9  |
| 0  | 1  | B6  | B7  | B8  | B9  | B10 |
| 0  | 0  | B7  | B8  | B9  | B10 | B11 |
| 1  | 0  | INVALID |||||
CELL TYPE 3
FIG. 3c

| SYMBOL LENGTH | PREFIX + SUB-TREE + SIGN | | | NO. OF SUB-TREE VARIATIONS |
|---|---|---|---|---|
| 6 | 6 | | ESC | 1 |
| 2 | 2 | | EOB | 1 |
| 2 | 1 | S | R0/L1 | 1 |
| 3 | 2 | S | R0/L1 | 1 |
| 4 | 3 | S | | 1 |
| 5 | 3 | 1 S | | 2 |
| 6 | 3 | 2 S | | 3 |
| 7 | 4 | 2 S | | 4 |
| 8 | 5 | 2 S | | 4 |
| 9 | 5 | 3 S | | 8 |
| 11 | 7 | 3 S | | 8 |
| 13 | 8 | 4 S | | 16 |
| 14 | 9 | 4 S | | 16 |
| 15 | 10 | 4 S | | 16 |
| 16 | 11 | 4 S | | 16 |
| 17 | 12 | 4 S | | 16 |

FIG. 13

| SYMBOL LENGTH | PREFIX + SUB-TREE + SIGN | NO. OF SUB-TREE VARIATIONS |
|---|---|---|
| 4 | [ 4 ] EOB | 1 |
| 6 | [ 6 ] ESC | 1 |
| 3 | [ 2 ] (S) | 1 |
| 4 | [ 3 ] (S) | 1 |
| 4 | [ 3 ] (S) | 1 |
| 5 | [ 4 ] (S) | 1 |
| 6 | [ 5 ] (S) | 1 |
| 6 | [ 4 ] [1] (S) | 2 |
| 6 | [ 4 ] [1] (S) | 2 |
| 7 | [ 4 ] [2] (S) | 4 |
| 8 | [ 5 ] [2] (S) | 4 |
| 8 | [ 7 ] (S) | 1 |
| 8 | [ 5 ] [2] (S) | 4 |
| 9 | [ 7 ] [1] (S) | 2 |
| 9 | [ 5 ] [3] (S) | 8 |
| 9 | [ 6 ] [2] (S) | 4 |
| 10 | [ 8 ] [1] (S) | 2 |
| 10 | [ 9 ] (S) | 1 |
| 11 | [ 9 ] [1] (S) | 2 |
| 13 | [ 8 ] [4] (S) | 10 |
| 14 | [ 9 ] [4] (S) | 12 |
| 15 | [ 10 ] [4] (S) | 16 |
| 16 | [ 11 ] [4] (S) | 16 |
| 17 | [ 12 ] [4] (S) | 16 |

FIG. 14

| SYMBOL LENGTH | PREFIX + SUB-TREE + SIGN | NO. OF SUB-TREE VARIATIONS |
|---|---|---|
| 11 | 8  3  MB_ESC | 1 |
| 1 | 1 | 1 |
| 3 | 2  1 | 2 |
| 4 | 3  1 | 2 |
| 5 | 4  1 | 2 |
| 7 | 6  1 | 2 |
| 8 | 6  2 | 4 |
| 8 | 7  1 | 2 |
| 10 | 7  3 | 6 |
| 11 | 9  2 | 4 |
| 11 | 8  3 | 8 |

FIG. 15

| SYMBOL LENGTH | PREFIX + SUB-TREE + SIGN | NO. OF SUB-TREE VARIATIONS |
|---|---|---|
| 1 | [1] | 1 |
| 2 | [ 2 ] | 1 |

FIG. 16

| SYMBOL LENGTH | PREFIX + SUB-TREE + SIGN | NO. OF SUB-TREE VARIATIONS |
|---|---|---|
| 1 | [1] | 1 |
| 2 | [ 2 ] | 1 |
| 3 | [  3  ] | 1 |
| 5 | [   4   ][±] | 2 |
| 6 | [    5    ] | 1 |

FIG. 17

| SYMBOL LENGTH | PREFIX + SUB-TREE + SIGN | NO. OF SUB-TREE VARIATIONS |
|---|---|---|
| 2 | [1][±] | 2 |
| 3 | [ 2 ][±] | 2 |
| 4 | [  3  ][±] | 2 |
| 5 | [   4   ][±] | 2 |
| 6 | [    5    ][±] | 2 |
| 6 | [     6     ] | 1 |

FIG. 18

| SYMBOL LENGTH | PREFIX + SUB-TREE + SIGN | NO. OF SUB-TREE VARIATIONS |
|---|---|---|
| 1 | 1 | 1 |
| 3 | 2 (S) | 1 |
| 4 | 3 (S) | 1 |
| 5 | 4 (S) | 1 |
| 7 | 6 (S) | 1 |
| 8 | 6 [1] (S) | 2 |
| 8 | 7 (S) | 1 |
| 10 | 8 [1] (S) | 2 |
| 10 | 9 (S) | 1 |
| 11 | 9 [1] (S) | 2 |
| 11 | 8 [2] (S) | 4 |

FIG. 19

| SYMBOL LENGTH | PREFIX + SUB-TREE + SIGN | NO. OF SUB-TREE VARIATIONS |
|---|---|---|
| 3 | 3 | 1 |
| 4 | 3 / 1 | 2 |
| 4 | 3 / 1 | 2 |
| 5 | 3 / 2 | 4 |
| 5 | 2 / 3 | 8 |
| 6 | 4 / 2 | 4 |
| 7 | 4 / 3 | 8 |
| 8 | 4 / 4 | 16 |
| 8 | 5 / 3 | 8 |
| 8 | 6 / 2 | 4 |
| 9 | 6 / 3 | 6 |

FIG. 20

| SYMBOL LENGTH | PREFIX + SUB-TREE + SIGN | NO. OF SUB-TREE VARIATIONS |
|---|---|---|
| 2 | 1 ▨ | 2 |
| 3 | 2 ▨ | 2 |
| 3 | 3 | 1 |
| 4 | 4 | 1 |
| 5 | 5 | 1 |
| 6 | 6 | 1 |
| 7 | 7 | 1 |
| 8 | 8 | 1 |
| 9 | 8 ▨ | 2 |

FIG. 21

| SYMBOL LENGTH | PREFIX + SUB-TREE + SIGN | NO. OF SUB-TREE VARIATIONS |
|---|---|---|
| 2 | 1 ▨ | 2 |
| 2 | 2 ▨ | 1 |
| 3 | 3 | 1 |
| 4 | 4 | 1 |
| 5 | 5 | 1 |
| 6 | 6 | 1 |
| 7 | 7 | 1 |
| 8 | 8 | 1 |
| 9 | 9 | 1 |
| 10 | 9 ▨ | 2 |

FIG. 22

| SYMBOL LENGTH | PREFIX + SUB-TREE + SIGN | | | NO. OF SUB-TREE VARIATIONS |
|---|---|---|---|---|
| 6 | 6 | ESC | | 1 |
| 2 | 2 | EOB | | 1 |
| 2 | 1 (S) | R0/L1 | | 1 |
| 3 | 2 (S) | R0/L1 | | 1 |
| 4 | 3 (S) | | | 1 |
| 5 | 3 | 1 (S) | | 2 |
| 6 | 3 | 2 (S) | | 3 |
| 6 | 3 | 2 (S) | | 3 |
| 7 | 4 | 2 (S) | | 4 |
| 8 | 5 | 2 (S) | | 4 |
| 9 | 5 | 3 (S) | | 8 |
| 11 | 7 | 3 (S) | | 8 |
| 13 | 8 | 4 (S) | | 16 |
| 14 | 9 | 4 (S) | | 16 |

FIG. 23

| SYMBOL LENGTH | PREFIX + SUB-TREE + SIGN | NO. OF SUB-TREE VARIATIONS |
|---|---|---|
| 11 | 8 / 3 / MB_STUFF | 1 |
| 1 | 1 | 1 |
| 3 | 2 / 1 | 2 |
| 4 | 3 / 1 | 2 |
| 5 | 4 / 1 | 2 |
| 7 | 6 / 1 | 2 |
| 8 | 6 / 2 | 4 |
| 8 | 7 / 1 | 2 |
| 10 | 7 / 3 | 6 |
| 11 | 9 / 2 | 4 |
| 11 | 8 / 3 | 8 |

FIG. 24

| SYMBOL LENGTH | PREFIX + SUB-TREE + SIGN | NO. OF SUB-TREE VARIATIONS |
|---|---|---|
| 1 | 1 | 1 |
| 2 | 2 | 1 |
| 3 | 3 | 1 |
| 4 | 4 | 1 |
| 5 | 5 | 1 |
| 6 | 5 | 1 |
| 7 | 7 | 1 |
| 8 | 8 | 1 |
| 9 | 9 | 1 |
| 10 | 10 | 1 |

FIG. 25

| SYMBOL LENGTH | PREFIX + SUB-TREE + SIGN | NO. OF SUB-TREE VARIATIONS |
|---|---|---|
| 1 | 1 | 1 |
| 3 | 2 S | 1 |
| 4 | 3 S | 1 |
| 5 | 4 S | 1 |
| 7 | 6 S | 1 |
| 8 | 6 ⌗1⌗ S | 2 |
| 8 | 7 S | 1 |
| 10 | 8 ⌗1⌗ S | 2 |
| 10 | 9 S | 1 |
| 11 | 9 ⌗1⌗ S | 2 |
| 11 | 9 ⌗1⌗ S | 2 |
| 11 | 10 S | 1 |
| 11 | 11 | 1 |

FIG. 26

| SYMBOL LENGTH | PREFIX + SUB-TREE + SIGN | NO. OF SUB-TREE VARIATIONS |
|---|---|---|
| 3 | 3 | 1 |
| 4 | 3 / 1 | 2 |
| 4 | 3 / 1 | 2 |
| 5 | 3 / 2 | 4 |
| 5 | 2 / 3 | 8 |
| 6 | 4 / 2 | 4 |
| 7 | 4 / 3 | 8 |
| 8 | 4 / 4 | 16 |
| 8 | 5 / 3 | 8 |
| 8 | 6 / 2 | 4 |
| 9 | 6 / 3 | 6 |

FIG. 27

| SYMBOL LENGTH | PREFIX + SUB-TREE + SIGN | NO. OF SUB-TREE VARIATIONS |
|---|---|---|
| 4 | [ 4 ]  EOB | 1 |
| 6 | [ 6 ]  ESC | 1 |
| 3 | [2] (S) | 1 |
| 4 | [3] (S) | 1 |
| 5 | [4] (S) | 1 |
| 5 | [3] [1] (S) | 2 |
| 6 | [3] [2] (S) | 4 |
| 7 | [4] [2] (S) | 4 |
| 8 | [4] [3] (S) | 8 |
| 9 | [4] [4] (S) | 16 |
| 10 | [5] [4] (S) | 16 |
| 11 | [8] [2] (S) | 4 |
| 11 | [9] [1] (S) | 2 |
| 11 | [10] (S) | 1 |
| 11 | [10] [1] | 2 |
| 12 | [9] [2] (S) | 4 |
| 12 | [10] [1] (S) | 2 |
| 12 | [10] [2] | 4 |
| 13 | [8] [4] (S) | 16 |

FIG. 28

| & 1+2 + ST1_VAR+SIGN | & 5+2 + ST4_VAR+SIGN | & 6+2 + ST4_VAR+SIGN | & 10+2 + ST4_VAR+SIGN |
|---|---|---|---|
| & 1+2 + ST1_VAR+SIGN | & 5+2 + ST4_VAR+SIGN | & 7+2 + ST4_VAR+SIGN | & 0+8 |
| & 1+2 + ST3_VAR+SIGN | & 4+2 + ST3_VAR+SIGN | & 8+2 + ST4_VAR+SIGN | |
| & 3+2 + ST2_VAR+SIGN | & 4+2 + ST3_VAR+SIGN | & 8+2 + ST4_VAR+SIGN | SPECIAL<br>& 0+16 |
| & 3+2 + ST2_VAR+SIGN | & 4+2 + ST3_VAR+SIGN | & 8+2 + ST4_VAR+SIGN | |
| & 3+2 + ST2_VAR+SIGN | & 4+2 + ST3_VAR+SIGN | & 8+2 + ST4_VAR+SIGN | |
| & 3+2 + ST2_VAR+SIGN | & 3+2 + ST2_VAR+SIGN | & 10+1 + ST4_VAR+SIGN | TOTAL OF 24 "AND" ELEMENTS |

FIG. 29

| OR1...OR5 | OR5...OR12 | OR6...OR13 | OR10...OR17 |
|---|---|---|---|
| &(1+2)+ST1+S | &(5+2)+ST4+S | &(6+2)+ST4+S | &(10+2)+ST4+S |

| OR1...OR5 | OR5...OR12 | OR7...OR14 | OR1...OR8 |
|---|---|---|---|
| &(1+2)+ST1+S | &(5+2)+ST4+S | &(7+2)+ST4+S | &(0+8) |

| OR1...OR7 | OR4...OR10 | OR8...OR15 | |
|---|---|---|---|
| &(1+2)+ST3+S | &(4+2)+ST3+S | &(8+2)+ST4+S | |

SPECIAL

| OR3...OR8 | OR4...OR10 | OR8...OR15 | OR1...OR16 |
|---|---|---|---|
| &(3+2)+ST2+S | &(4+2)+ST3+S | &(8+2)+ST4+S | &(0+16) |

| OR3...OR8 | OR4...OR10 | OR8...OR15 | |
|---|---|---|---|
| &(3+2)+ST2+S | &(4+2)+ST3+S | &(8+2)+ST4+S | |

| OR3...OR8 | OR4...OR10 | OR8...OR15 | |
|---|---|---|---|
| &(3+2)+ST2+S | &(4+2)+ST3+S | &(8+2)+ST4+S | |

| OR3...OR8 | OR3...OR8 | OR10...OR16 | |
|---|---|---|---|
| &(3+2)+ST2+S | &(3+2)+ST2+S | &(10+1)+ST4+S | |

FIG. 30

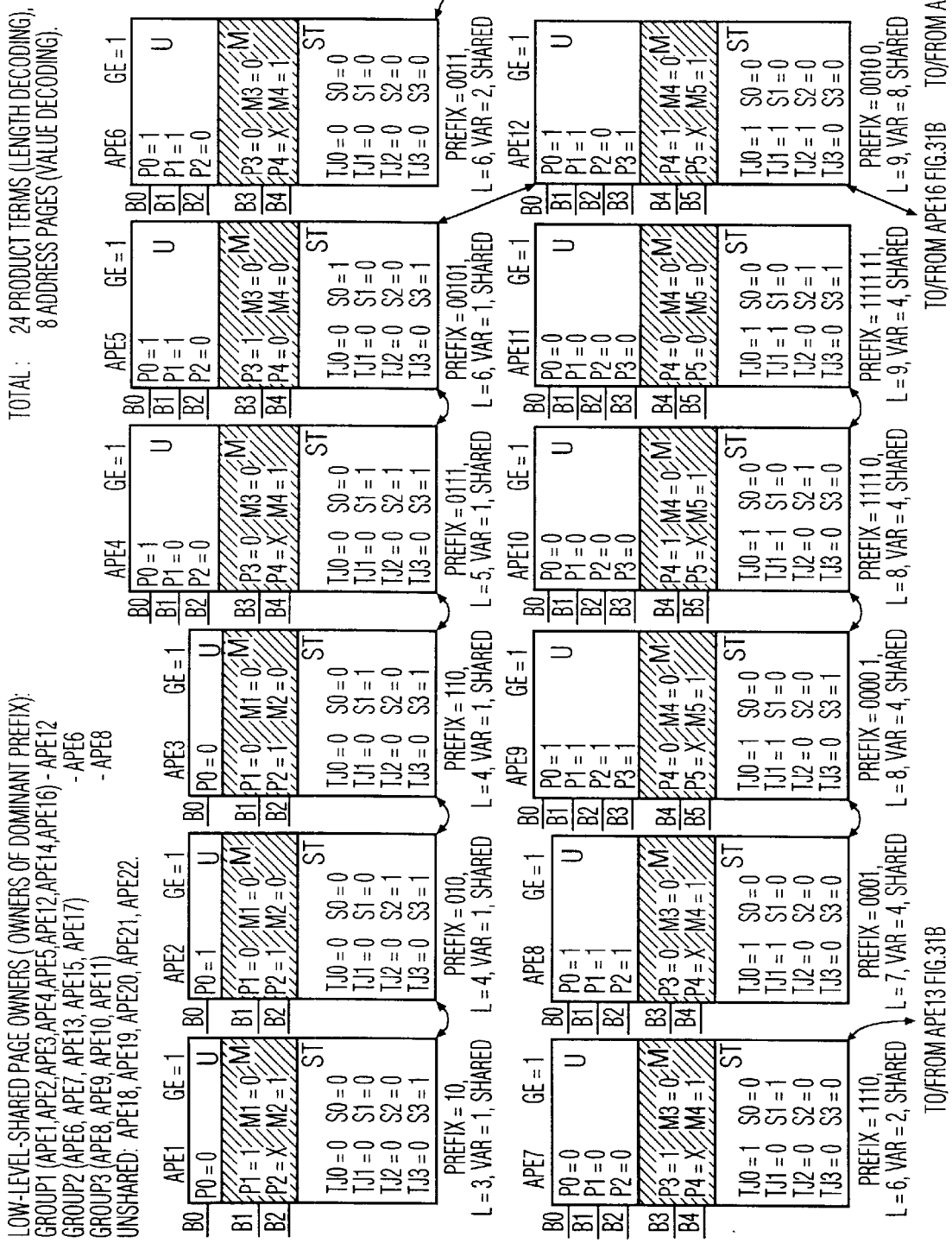

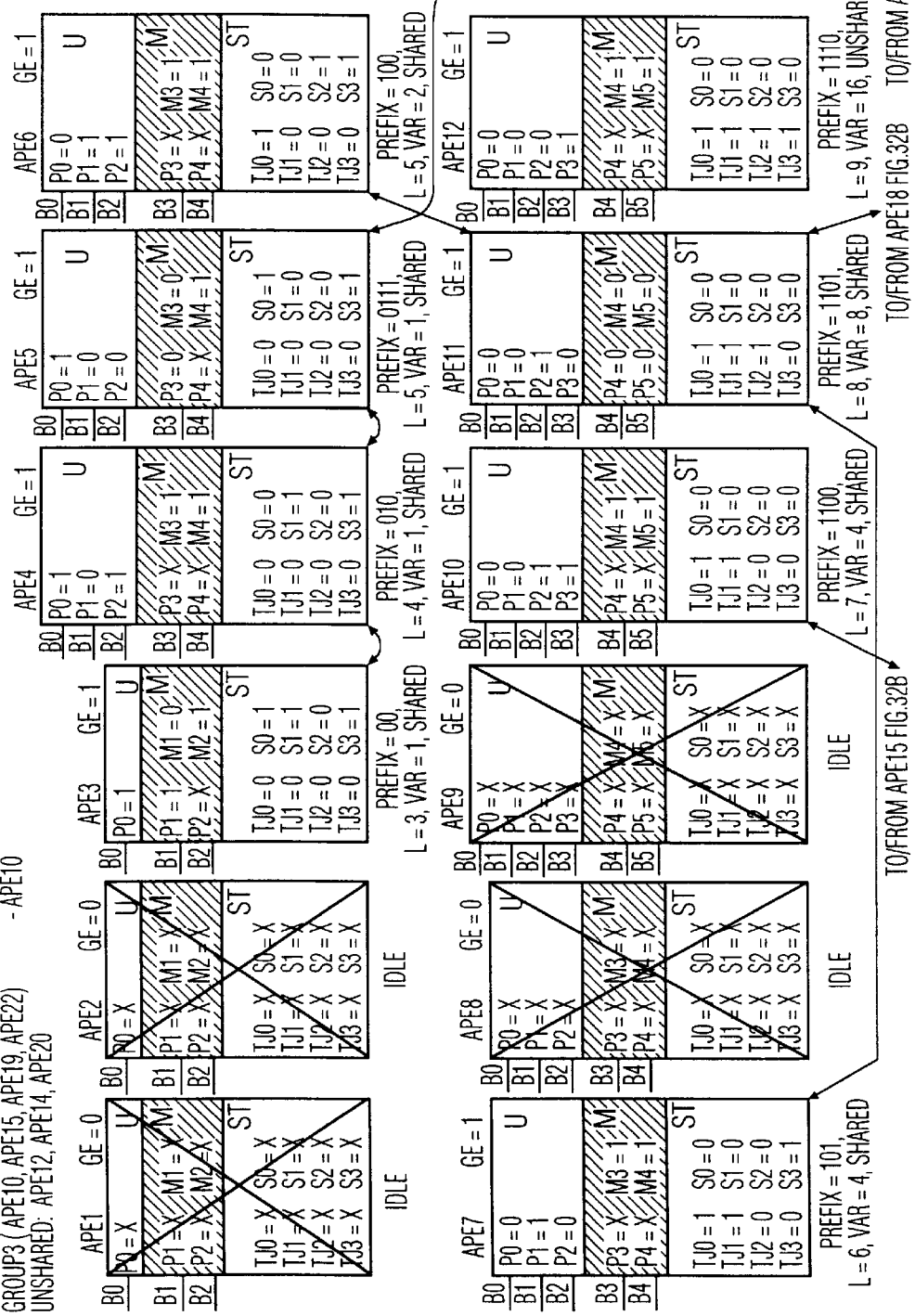

UNIVERSALLY PROGRAMMABLE VARIABLE LENGTH DECODER

BACKGROUND OF THE INVENTION

The present invention relates generally to variable length decoders (VLDs) used in data transmission systems, such as digital video data transmission systems, and more particularly, to a VLD which is programmable for decoding digital video data streams which are encoded in accordance with any of various different digital video compression (encoding) standards, including both current coding protocols such as MPEG-1, MPEG-2, JPEG, H.261, H.263, DVC, and evolving and future coding protocols such as MPEG-4, H.263+, standard extensions, etc.

Efficient communication protocols are used in the transmission of digitally compressed images. These protocols have been created to target different applications, such as standard- and high-definition television, video conferencing, video recording on magnetic tape, and still image transmission. Some protocols have been standardized, such as MPEG-1, MPEG-2, JPEG, H.261, H.263, DVC, and many others. Other protocols are being developed to become standardized in the future, such as MPEG-4, H.263+, and standard extensions. Huffman codes are used in all of these protocols to compress various components of video data. Variable length decoders (VLDs) are used in digital video decoders to decode Huffman-encoded bit streams consisting of variable length coded (VLC) words or symbols.

There are striking general similarities among the different digital video compression standards. For example, most of the video compression standards take advantage of motion estimation to achieve temporal data compression, and the quantized Discrete Cosine Transform (DCT) to achieve spatial data compression. As a result, the "DCT block" and "macroblock" data representations are used almost universally, and code words such as DC and AC coefficients and motion vectors are treated almost identically in many standards. Provided that such fundamental data types along with other information have been decoded by the VLD, this data can be used in a universal decoder capable of decoding multiple compression standards. The video decoders, however, differ drastically in algorithms prescribed for their respective VLDs.

Digital video decoders generally perform four consecutive functions: variable length decoding, inverse quantization, inverse discrete cosine transform and motion compensation. The functions of variable length decoding, inverse quantization and inverse discrete cosine transform are used almost universally, while the function of motion compensation is used in some (MPEG-2, H.261) and is not used in other (JPEG, DVC) compression standards.

In digital video decoder designs, the compressed digital video bit streams are normally buffered using a sufficient amount of memory generally prescribed by a compression standard. The VLD is generally preceeded by a buffer memory called a "rate buffer". The bit width of a bit stream segment stored in the rate buffer is normally defined by the longest word in the compression protocol, which does not exceed 32 bits in the currently used video compression standards. The Huffman encoded data bits of this stored segment are presented to the VLD circuits for decoding.

Both dedicated and programmable VLDs must perform three distinct functions: bit stream segmentation or parsing, reconstruction of data values, and predicting the type of a Huffman symbol that follows. In this fashion, the VLD can produce the value of the current symbol, advance to the next symbol in the bit stream segment, and then select an appropriate table for its decoding.

The fundamental table look-up VLD is disclosed in U.S. Pat. No. 5,173,695, issued to Sun et al., the disclosure of which is incorporated herein by reference. This dedicated VLD includes a barrel shifter that provides an output decoding window having a bit width equal to the maximum-length code word. In response to a control signal, the barrel shifter directly shifts its decoding window across a sequence of available input bits as each code word is detected. To detect each code word, the leading bits in the decoding window are compared with code word entries in a look-up table. When a code word is detected, its corresponding code word length is added to the value of an accumulator with previously accumulated code word lengths to produce the control signal which directly shifts the decoding window by the number of bits in the just decoded word. Thus, the decoding window is shifted to the beginning of the next code word in the undecoded sequence of available input bits. The shifting of the decoding window and the decoding of the code word can be accomplished in one clock cycle. As a result, the table look-up decoder is capable of decoding one code word per clock cycle regardless of its bit length, thereby increasing the data throughput of the VLD relative to the previously available tree searching algorithm VLD. For reference, an advanced tree searching algorithm VLD ("Multi-Code-Book Variable Length Decoder") is disclosed in the present inventor's U.S. patent application Ser. No. 08/580,404, filed on Dec.28, 1995, which is assigned to the assignee of the present invention, and the disclosure of which is incorporated herein by reference.

It should be noted that the present inventor (along with co-inventors Victor L. Gornstein and Howard B. Pein) has developed a unique VLD architecture which greatly improves the speed of VLD operation by utilizing a "one-hot" data representation in the VLD, resulting in a VLD architecture which greatly accelerates the timing critical length decoding loop, which VLD architecture is disclosed in U.S. Pat. No. 5,650,905, issued on Jul. 22, 1997, and U.S. application Ser. No. 08/671,891 (which is a C-I-P of the '905 patent), filed on Jun. 28, 1996. These patents are also assigned to the assignee of the present invention, and are also incorporated herein by reference. With the one-hot architecture of the length decoding loop, the barrel shifter is preferably replaced by a one-hot bit stream barrel shifter matrix, the conventional word length decoder is replaced by a one-hot word length decoder, and the adder-accumulator is replaced by a one-hot ring barrel shifter matrix and a one-hot overflow matrix. Although not limiting to the present invention, this one-hot data representation and one-hot length decoding loop architecture is utilized in the preferred embodiment of the present invention disclosed hereinafter.

Although the number of variable length code variations in the Huffman look-up tables is relatively small, straightforward utilization of memories in both length- and value-decoders is impractical, due to the very wide address field which is required. For this reason, and also due to speed considerations in many applications, such as HDTV, a logic array decoding structure is normally utilized. Typically, the logic array decoding structure includes a plurality (plane) of fixed-width AND gates each of whose input signals have been selectively inverted to match a respective different one of all of the possible Huffman codes which are prescribed by the coding protocol employed. The AND plane is followed by an OR plane in which all code variations which lead to the same decoding results are combined to produce an output.

It becomes readily apparent that such a logic array decoding structure is dedicated to decoding bit streams which are encoded in accordance with a single fixed coding protocol (compression standard). Thus, since it is not programmable, it is incapable of decoding bit streams which are encoded in accordance with any other coding protocol.

At the present time, there is a need in the industry for a VLD which is programmable for decoding digital video (and other Huffman-encoded) data streams which are encoded in accordance with any of various different digital video compression standards, including both current coding protocols such as MPEG-1, MPEG-2, JPEG, H.261, H.263, DVC, and evolving and future coding protocols such as MPEG-4, H.263+, standard extensions, etc. In parsing the bit stream, substantial propagation delay in the length decoding loop of a VLD is a well known problem which is especially hard to overcome in HDTV applications where the data throughput can be extremely high. The introduction of the programmability feature should not substantially sacrifice the speed of the VLD operation. For this reason, it is preferable that such a programmable VLD (PVLD) be optimized to allow for the highest speed of this length decoding loop, which is the most timing critical part of any VLD. Further, it is preferable that such a PVLD use a minimal amount of memory and be made compact enough to fit into a media processor. The present invention fulfills this need in the art.

SUMMARY OF THE INVENTION

The present invention encompasses a programmable variable length decoder (PVLD) for decoding an input digital data stream which includes a plurality of variable length code words which are coded in accordance with any of a plurality of different coding standards. The variable length decoder includes an input circuit which receives the input digital data stream and produces a decoding window that includes a leading word aligned bit stream, and a decoding circuit which is configurable into any selected one of a plurality of different decoding configurations, depending upon which coding standard the input digital data stream is coded in accordance with, the decoding circuit being coupled to the leading word aligned bit stream for decoding the length and value of each code word in the input digital data stream.

The variable length decoder further includes a programmable controller for controlling the operation of the variable length decoder in accordance with any of a plurality of different decoding protocols, depending upon the coding standard employed in coding the input digital data stream. The programmable controller determines which coding standard was employed in coding the input digital data stream, and then automatically configures the decoding circuit into the decoding configuration which is appropriate for decoding the input digital data stream, based upon this determination.

The variable length decoder also includes a code word value memory which is used for decoding the values of the code words in the input digital data stream. The code word value memory is logically organized into a plurality of individually addressable pages, at least one of which stores a code prefix and a plurality of sub-trees associated with another code prefix, to thereby maximize memory utilization and minimize the required memory size.

The PVLD of the present invention is preferably universally programmable for decoding digital video (and other Huffman-encoded) data streams which are encoded in accordance with any of various different digital video compression standards, including both current coding protocols such as MPEG-1, MPEG-2, JPEG, H.261, H.263, DVC, and evolving and future coding protocols such as MPEG-4, H.263+, standard extensions, etc.

The programmability of the PVLD of the present invention is preferably achieved with a fully programmable logic array (PLA) consisting of a programmable AND plane and a programmable OR plane which has inputs coupled to the outputs of the AND plane, and is controlled by a universally programmable state machine. The programmable AND plane includes a set of individual AND plane elements, at least a plurality of which each have one or more inputs which can be selectively masked in order to render that AND gate responsive to a selected combination of input bits (i.e., code).

Masked inputs are the inputs that are disabled to ignore the trailing end of the bit stream segment unrelated to the symbol currently being decoded. The input logic to these gates includes a programmable inverter and a means to force inputs into a logic "HIGH" (ignore) state. Various code prefixes from the outputs of individually configured AND plane elements are combined in the OR plane in order to produce a one-hot data representation of the code length of the leading code word. The programmability of the OR plane is achieved by means of routing control bits applied to selected inputs of the appropriate OR gates within the OR plane. The values of the OR plane routing control bits and AND plane mask bits are preferably provided by a PLA Setup RAM which stores the proper values thereof for all programmable (possible) PLA configurations.

The PVLD of the present invention utilizes the above-described PLA to accelerate length decoding, and preferably utilizes a Value RAM with address page sharing for value decoding, in order to minimize the amount of memory required. A low-memory, single-bit-driven, preprocessor-assisted, PVLD-specific state machine capable of operating in both parallel and tree searching modes, is also preferably utilized in the PVLD of the present invention.

BRIEF DESCRIPTION OF THE DRAWINGS

The above and other objects, features, and advantages of the present invention will become apparent from the followed detailed description taken in conjunction with the accompanying drawings, in which:

FIGS. 1a–c are diagrams which illustrate various aspects of the basic inventive concept of a variable-width maskable AND plane for Huffman codes;

FIG. 13 is a diagram which illustrates the MPEG-2 AC Coefficient Table 0 structure;

FIG. 14 is a diagram which illustrates the MPEG-2 AC Coefficient Table 1 structure;

FIG. 15 is a diagram which illustrates the MPEG-2 Macroblock Addressing Table structure;

FIG. 16 is a diagram which illustrates the MPEG-2 Macroblock Type Table structure (I-Pictures);

FIG. 17 is a diagram which illustrates the MPEG-2 Macroblock Type Table structure (P-Pictures);

FIG. 18 is a diagram which illustrates the MPEG-2 Macroblock Type Table structure (B-Pictures);

FIG. 19 is a diagram which illustrates the MPEG-2 Motion Vectors Table structure;

FIG. 20 is a diagram which illustrates the MPEG-2 Macroblock Pattern Table structure;

FIG. 21 is a diagram which illustrates the MPEG-2 DC Size Table structure (Luminance);

FIG. 22 is a diagram which illustrates the MPEG-2 DC Size Table structure (Chrominance);

FIG. 23 is a diagram which illustrates the H.261 Transform Coefficients Table structure;

FIG. 24 is a diagram which illustrates the H.261 Macroblock Addressing Table structure;

FIG. 25 is a diagram which illustrates the H.261 Macroblock Type Table structure;

FIG. 26 is a diagram which illustrates the H.261 Motion Vector Data Table structure;

FIG. 27 is a diagram which illustrates the H.261 Coded Block Pattern Table structure;

FIG. 28 is a diagram which illustrates the DVC AC Coefficient Table structure;

FIG. 29 is an optimized AND plane specification for MPEG-2, H.261, and DVC;

FIG. 30 is an optimized OR plane specification for MPEG-2, H.261, and DVC;

DETAILED DESCRIPTION OF THE INVENTION

Figure 2:
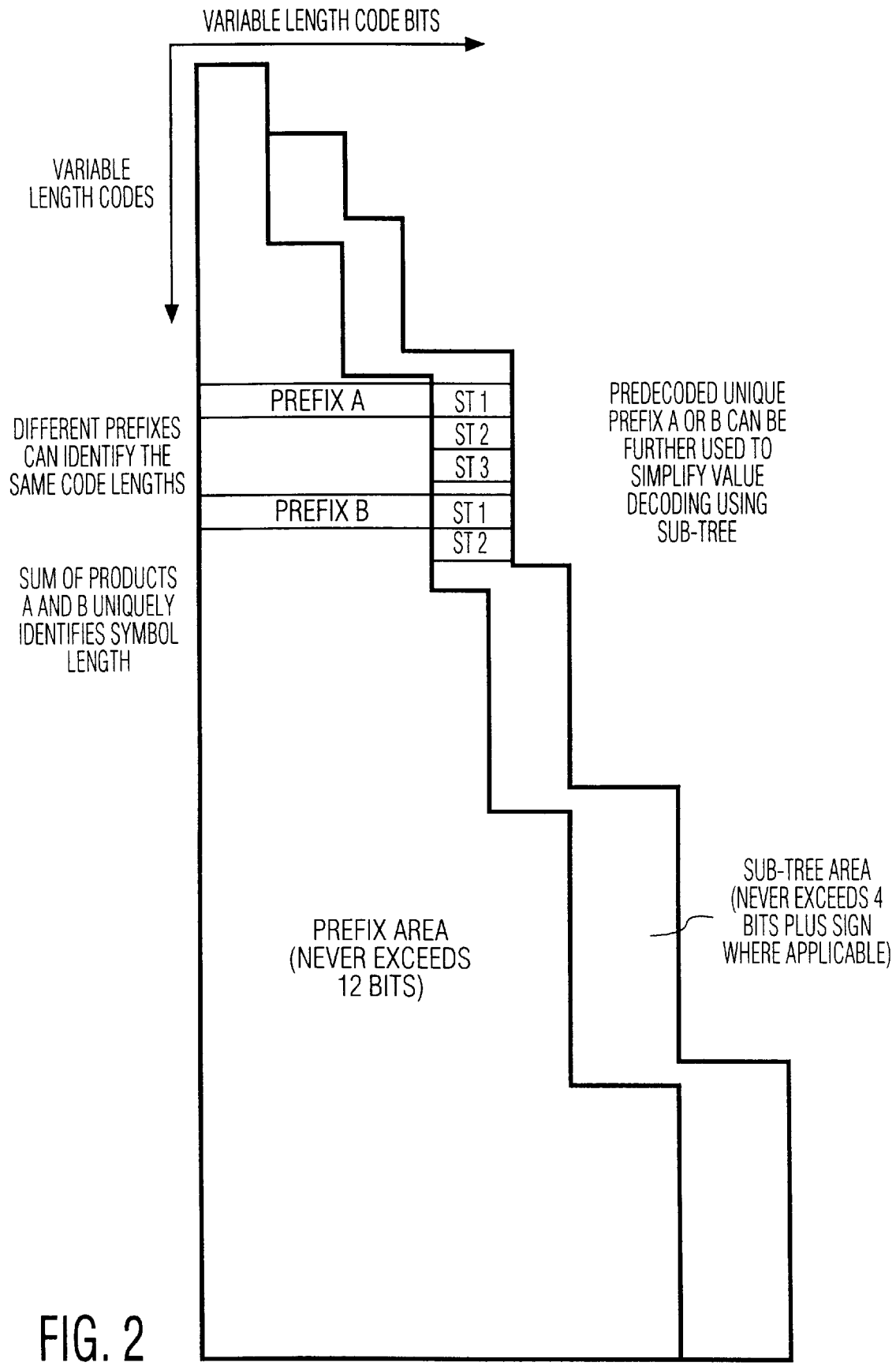
FIG. 2 is a diagram which illustrates a typical Huffman table structure.

While the present invention is described herein with reference to illustrative embodiments for particular applications, it should be understood that the invention is not limited thereto. Those having ordinary skill in the pertinent art and access to the teachings provided herein will recognize additional modifications, applications, and embodiments within the scope thereof and additional fields in which the present invention would be of significant utility.

In overview, the present invention is directed to a VLD which is universally programmable for decoding digital video (and other Huffman-encoded) data streams which are encoded in accordance with any of various different digital video compression standards, including both current coding protocols such as MPEG-1, MPEG-2, JPEG, H.261, H.263, DVC, and evolving and future coding protocols such as MPEG-4, H.263+, standard extensions, etc. The programmability of the PVLD of the present invention is achieved with a fully programmable logic array (PLA) consisting of a programmable AND plane and a programmable OR plane which has inputs coupled to the outputs of the AND plane, and is controlled by a universally programmable state machine. The programmable AND plane includes a set of individual AND plane elements, at least a plurality of which each have one or more inputs which can be selectively masked in order to render that AND gate responsive to a selected combination of input bits (i.e., code). Masked inputs are the inputs that are disabled to ignore the trailing end of the bit stream segment unrelated to the symbol currently being decoded. The input logic to these gates includes a programmable inverter and a means to force inputs into a logic "HIGH" (ignore) state. Various code prefixes from the outputs of individually configured AND plane elements have to be combined in the OR plane in order to produce an output indicative of code to length, as will be explained in detail hereinafter. The programmability of the OR plane is achieved by means of control bits (hereinafter referred to as "rout bits") applied to selected inputs of the appropriate OR gates within the OR plane. The values of the OR plane rout bits and AND plane mask bits are preferably provided by a PLA Setup RAM which stores the proper values thereof for all programmable (possible) PLA configurations, in a manner to be described in detail hereinafter.

The PVLD of the present invention utilizes the above-described PLA to accelerate length decoding, and preferably utilizes a Value RAM with address page sharing for value decoding, in order to minimize the amount of memory required. The Value RAM address page sharing technique is described in detail hereinafter. A low-memory, single-bit-driven, preprocessor-assisted, PVLD-specific state machine capable of operating in both parallel and tree searching modes, also described in detail hereinafter, is preferably utilized in the PVLD of the present invention.

Given the pyramidal structure of Huffman codes, where a code length is inversely proportional to a probability of code occurrence in the bit stream, a programmable variable-width maskable AND plane using a structured Huffman table approach is most appropriate. This plane consists of a set of AND gates of increasing width designed in such a way that the leading-bit inputs are unmasked (never ignored) and a small number of trailing-bit inputs are masked (can be ignored). Both unmasked (U) and masked (M) inputs are coupled to a programmable inverter (See FIG. 1a). Such AND gates can be programmed to have a width from U to U+M. The number of masked inputs for each AND gate is not necessarily the same, and can be equal to zero for some gates that are chosen to be fixed. Substantial logic and set-up memory resource savings can be realized in such a structure.

Optimization of such an AND plane in order to provide adequate logic resources along with minimal logic overhead is crucial. Generally, the level of programmability increases as the number of masked inputs increases. On the other hand, an increase in the number of masked inputs (i.e., the "masked area") is accompanied by higher logic utilization. Therefore, a compromise solution has to be found for each particular application, depending upon the specific requirements of that particular application. These principles are diagrammatically illustrated in FIGS. 1b and 1c.

A typical Huffman table structure is shown in FIG. 2. The code lengths can be uniquely identified by a code prefix that can be followed by a sub-tree that uniquely identifies a set of values for the codes having the same bit length. In many codes, the last bit of a sub-tree is a sign bit. Since the sign bit is the last bit in the code word that can assume both "HIGH" and "LOW" logic levels, its value does not affect either the look-up circuits for value decoding nor is it involved in the code length determination process.

As shown in FIG. 2, the present inventor has recognized that different code prefixes (A and B) can identify the same code length and different sets of values. The sum of products A and B will uniquely identify the length of the symbol, while each of these prefixes can be used as an intermediate logic term to simplify decoding of the associated set of values.

Analysis of Huffman tables used in the currently available compression standards reveals that the code prefix area does not exceed 12 bits, while the sub-tree area does not exceed 4 bits plus sign where applicable. Thus, the code length variation for a prefix is currently 1 to 12 bits, and the code length variation for a sub-tree is currently 0 to 4 bits with a possibility of a sign at the end. These observations can be effectively used to constrain and conserve the PLA's logic resources in a programmable VLD.

Figure 3:
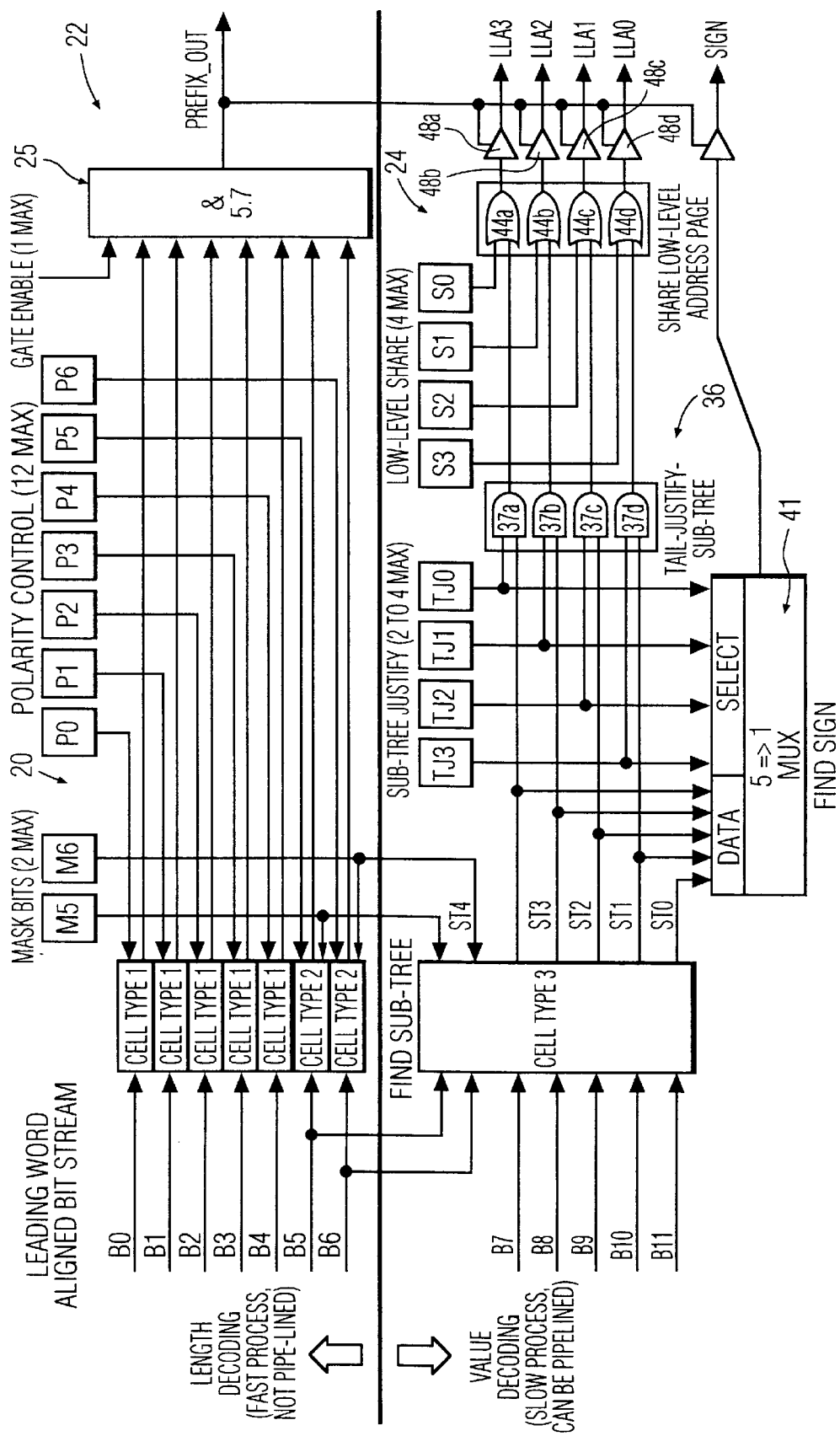
FIG. 3 is a block diagram of a programmable AND plane element constructed in accordance with an exemplary embodiment of the present invention.

An exemplary basic programmable AND plane element 20 with 5 unmasked inputs and 2 masked inputs (U=5, M=2) is depicted in FIG. 3. This AND plane element 20 incorporates both length and value decoding sections 22,24, respectively. It can be programmed to handle prefix codes of 5 to 7 bits long, the worst-case sub-tree in the range from 0 to 4 bits, and the sign bit in any position, if necessary.

The AND plane element 20 includes a variable-width programmable AND gate 25 which is included in the code length decoding loop of the PVLD. In such applications as HDTV, for example, the propagation delays through this section have to be as small as possible. The AND gate configuration is programmed using the outputs of a PLA Setup RAM, which is diagrammatically depicted in FIG. 3 by a distributed set of small boxes labelled with the different setup bits (PLA configuration data) which the PLA Setup RAM (shown as a whole in FIGS. 5 and 9) stores and outputs (e.g., P0–P6; M5–M6; TJ3–TJ0; S3–S0; E). The PLA configuration data are written to the PLA Setup RAM in the PVLD initialization cycle. If the AND gate 25 is not used in a particular configuration, it can be turned off (disabled) by assigning a logic "LOW" level to the gate enable bit E of the PLA Setup RAM. This disables its effects on the OR plane (see FIGS. 4, 5 and 9) that follows. An extra input can be added to all AND gates of the AND plane (see FIGS. 4, 5 and 9) in order to provide the "turn-off" control from the PVLD controller, if necessary.

Bits B0 to B4 of the leading word aligned bit stream are applied to five unmasked inputs of respective programmable inverter cells, (each of which can be implemented as an XOR gate 27), which are designated in FIG. 3 as "type 1 cells". The input polarity control bits P0 to P4 from the PLA Setup RAM define whether the signals have to be inverted at the corresponding inputs of the AND gate 25 to match the prefix code that this element is programmed to detect. The XOR gate 27 in a type 1 cell performs this function.

Bits B5 and B6 of the bit stream are applied to two masked inputs of "type 2 cells", which are programmable maskable inverter cells consisting of an XOR gate 29 and an OR gate 31. Similarly, the input polarity control bits P5 to P6 of the PLA Setup RAM define whether the signals have to be inverted at the corresponding inputs of the AND gate 25 to match the prefix code. The XOR gate 29 in a type 2 cell performs the programmable inverter function. The OR gate 31 output is forced to a logic "HIGH" (ignore) state by one of the mask bits M5 or M6 of the PLA Setup RAM, and thus performs the masking function.

As a result, the AND gate 25 of FIG. 3. can be programmed for 5-, 6- and 7-bit operation. The output PREFIX_OUT of this element is used to uniquely identify the word length further in the OR plane, and to enable the output of the lower (value decoding) section 24 used to efficiently address the word values by the extra bits that can be available in the sub-tree.

Since the AND gate 25 shown in this example can be 5- to 7-bits wide, the sub-tree (if present) can start at bit positions B5, B6 or B7, depending upon how it is programmed. The starting position is uniquely identified by the mask bits M5 and M6. These bits are applied to a "type 3 cell" whose function is to find a sub-tree in these three possible cases. The truth fable for this type 3 cell is provided at the bottom right of FIG. 3.

If both bits M5 and M6 are "HIGH", the AND gate 25 width is 5 bits, and the longest 4-bit sub-tree plus sign are to be found in bits B5 to B9. If bit M5 is "LOW" and bit M6 is "HIGH", the AND gate width is 6, and the 4-bit sub-tree and sign are located in bits B6 to B10. Similarly, for a 7-bit wide AND gate, both bits M5 and M6 are programmed "LOW", and the sub-tree and sign reside in bits B7 to B11. The "HIGH" assignment for M5 combined with the "LOW" assignment for M6 is not allowed, because the code can not be "broken", i.e., all bits must be contiguous.

The sub-tree and sign bit portion of the bit stream are applied to the outputs ST4 to ST0 of the type 3 cell. The sub-tree is utilized to address the VLC Value RAM (See FIG. 9) which stores the associated values. Since the sub-tree has a variable length of from 0 to 3 bits, and can be followed by a sign bit, the capability to ignore the irrelevant bits has to be provided. The sub-tree has to be justified, and the redundant bits have to be masked in order to provide a unique fixed-size low-level page address to the VLC Value RAM. The sign bit also has to be located.

One of the ways to justify the sub-tree would be to shift bits ST4 to ST0 by the prescribed number of bits with a "zero" fill in the unused bit positions. An illustrative implementation presented in FIG. 3 performs reversing of the sub-tree code by setting the redundant portion of the sub-tree to the logic "LOW" level starting from the trailing end of the sub-tree. The Setup RAM bits TJ3 to TJ0 are used to mask (force to the logic "LOW" level in this case) the redundant bits of the sub-tree. For example, if the expected sub-tree for the associated code prefix is 4-bits wide, all bits TJ3 to TJ0 are set "HIGH" to pass all the sub-tree bits further, i.e., through respective sub-tree justify AND gates 37a–37d. If all the sub-tree justify bits are "LOW" (no sub-tree is expected), all the sub-tree bits are forced "LOW", thereby forcing the outputs of all of the sub-tree justify AND gates 37a–37d "LOW". If the expected sub-tree is 2-bits wide, bits ST2 and ST1 of the sub-tree are masked by setting bits TJ3 and TJ2 "LOW". Bits TJ1 and TJ0 are set "HIGH" to pass the 2-bit sub-tree present in bits ST4 and ST3. Such reverse-justify operation preserves the uniqueness of the sub-tree code used further for addressing the lower page of the Value RAM in the fixed length form.

The location of a sign bit immediately following the sub-tree can be easily determined by a simple multiplexer 41 controlled by the same sub-tree justify bits TJ3 to TJ0.

In the presently preferred embodiment, the PVLD architecture incorporates three steps of reduction of the address field of the Value RAM—using a code prefix instead of the bit stream itself, low-level address page sharing, and high-level address page sharing, for the primary purpose of minimizing the required PVLD memory resources.

The sub-trees that are 4-bits long will address a full page of 16 values in the Value RAM. This low-level address page is, in turn, addressed using the code prefix decoded in the upper (length decoding) section 22 of the AND plane element 20 depicted in FIG. 3. The sub-trees with a lower number of bits can only address a part of such page with the rest of the page unused. For example, if a sub-tree is not present, only one address of the page will contain useful data. Two bits of a sub-tree will address only 4 useful memory locations. It can be easily appreciated that a better solution has to be found for more efficient memory utilization. In silicon implementations, the amount of the embedded memory can be crucial for product feasibility.

If a number of code prefixes that a design supports is selected to be equal to 25, for example, then the low-level address page will have to be addressed by 5 bits. Consequently, a significant portion of the Value RAM memory space will not be utilized efficiently. To improve memory utilization, low-level address page sharing as described below is employed.

A group of programmable OR gates 44a–44d following the sub-tree justification circuit 36 is utilized in the AND plane element 20 depicted in FIG. 3 for this purpose. If the "5+2" AND plane element 20 (meaning 5 "U" (unmasked) inputs and 2 "M" (masked) inputs) is programmed to accept a 2-bit sub-tree, the lower redundant two bits of the sub-tree are forced "LOW" at the outputs of the sub-tree justify AND gates 37a–37d of the sub-tree justification circuit 36. These bits can now be easily manipulated using the low-level share bits S3 to S0 of the Setup RAM. In order to provide low-level address page sharing, another one or more AND plane elements have to be involved.

As a simple example, assume that three other AND plane elements are also required to have 2-bit sub-trees. The two zero-enforced redundant bits in each of these elements are programmed to have different code values amongst them. Zero-enforcing the value onto these redundant bits is performed by the low-level share bits S3 and S2. To enforce a logic "HIGH" level, a "HIGH" level of the S bit is required. To enforce a "LOW" level or to pass a value unchanged, a "LOW" level of the S bit is required. In this example, by placing three groups of sub-trees into a page reserved for a different prefix, the number of prefixes required for addressing a code value is effectively reduced by 3, i.e., from 25 to 22.

As another example, assume that in the same AND plane another 3-bit sub-tree should be shared on its low-level address page with one 2-bit sub-tree and two 1-bit sub-trees (for a total of 16 (8+4+2+2) address locations) to be used to its full potential. Without low-level address page sharing, the involved sub-trees would have the following outputs (X is a sub-tree data bit):

| | |
|---|---|
| Sub-tree 1 (3-bit): | XXX0. |
| Sub-tree 2 (2-bit): | XX00. |
| Sub-tree 3 (1-bit): | X000. |
| Sub-tree 4 (1-bit): | X000. |

To facilitate low-level address page sharing, these sub-trees within their respective AND plane elements are modified as follows:

| | |
|---|---|
| Sub-tree 1 (3-bit): | XXX0. |
| Sub-tree 2 (2-bit): | XX01. |
| Sub-tree 3 (1-bit): | X011. |
| Sub-tree 4 (1-bit): | X111. |

In this example, by placing three groups of sub-trees into a page reserved for a different prefix, the number of prefixes required for addressing a code value is further reduced by 3, i.e., from 22 to 19.

Given the pyramidal structure of Huffman codes, it is easy to find in every reasonably large Huffman table a large number of low-bit sub-trees and codes that do not have sub-trees. As illustrated, these codes are easily folded into other pages. In the above example, a reduction in the number of prefix terms from 25 to 16 can be easily achieved. As a result, the 5-bit code that was originally required to represent 25 prefix terms, can be reduced to 4 bits. A single bit reduction in the memory address field reduces the required Value RAM size by a factor of two.

The shared low-level address lines LLA3 to LLA0 and the sign bit are multiplexed with other low-level address lines of the same plane using, for example, tri-state buffers 48a–48d which are enabled locally by the PREFIX_OUT output signal of its associated AND gate 25.

The value decoding section 24 of the PVLD is located outside of the timing critical length decoding loop, as can be seen in FIG. 3. More involved logic circuitry is allowed in the value length decoding loop because it can be easily pipelined.

In the above-described low-level PVLD architecture, various configurations of AND gates and sub-tree handling capabilities can be built into each individual AND plane element provided that its output interface is identical to others. If, for example, a particular element has a fixed AND width, and is designed to handle a sub-tree of up to two bits only, a type 3 cell for this element will not be required since the position of a sub-tree is known. The sign multiplexer, as well as the remaining components of the low-level sharing circuit, will also be simplified. The pyramidal structure of Huffman codes will translate into a somewhat identical distribution of complexity levels among the AND plane elements.

Various code prefixes from the outputs of individually configured AND plane elements have to be combined in the OR plane in order to produce an output indicative of code length. The OR plane needs a limited amount of setup from the Setup RAM to configure its inputs.

Figure 4:
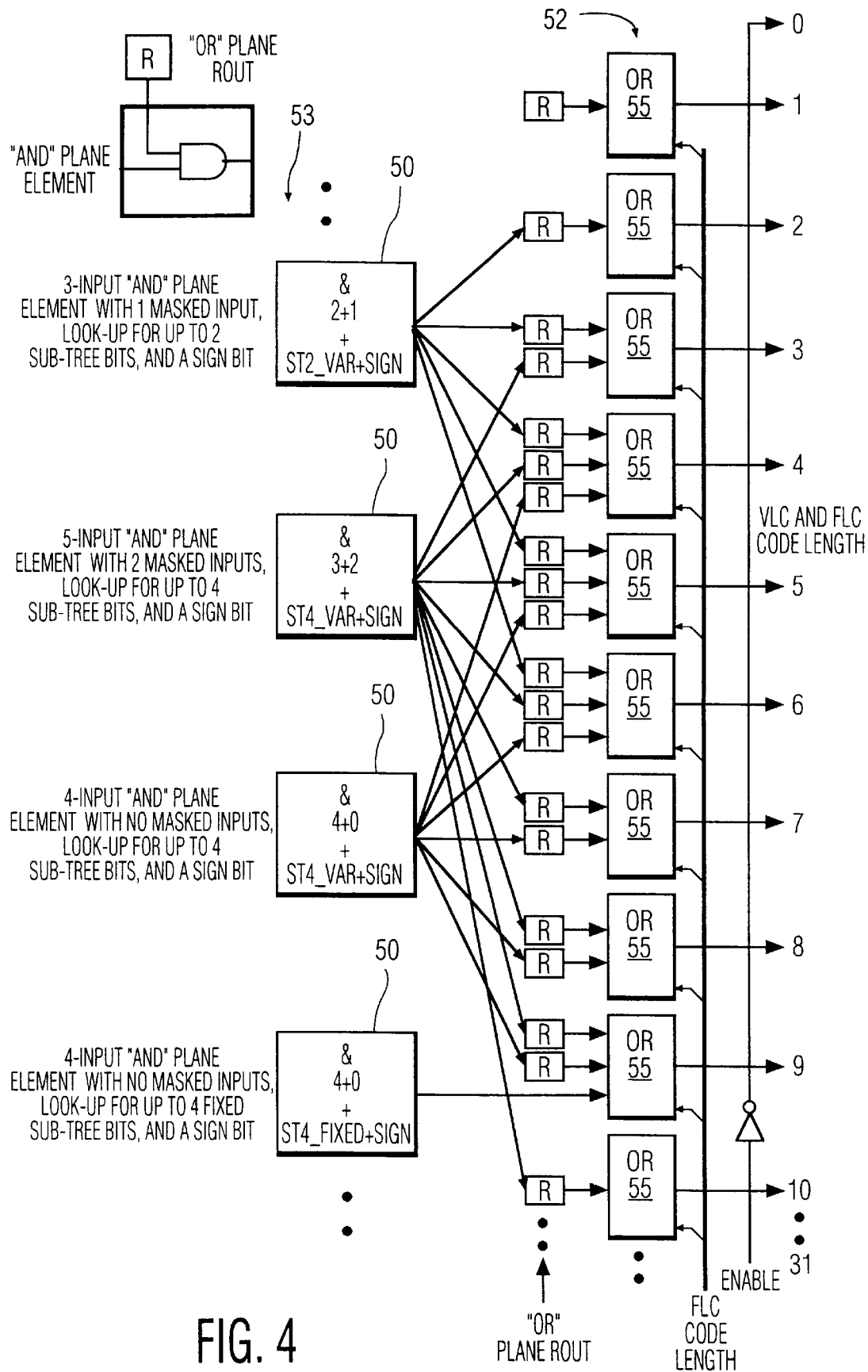
FIG. 4 is a block diagram of an AND-OR plane arrangement according to an exemplary embodiment of the present invention.

In an exemplary embodiment depicted in FIG. 4, four types of AND plane elements 50 are combined at the OR plane 52. The upper AND plane element 50 is configured as a "2+1" AND gate, i.e., it has 2 "U" (unmasked) inputs and 1 "M" (masked) input. The possible code lengths associated with this element are as follows. The smallest code length is equal to the smallest width of the AND gate, i.e., 2, assuming that the sub-tree and sign are not used. The highest code length is 6, assuming that the highest usable width of the gate is equal to 3, and the maximum sub-tree of 2 bits is followed by 1 sign bit. All values between 2 and 6 are possible for this element. Similarly, the code lengths of the other three AND plane elements 50 depicted in FIG. 4 are defined by the number of "U"+"M" inputs, + by the number of accepted sub-tree bits (STN_)+ by whether the sub-tree bits are fixed (FIXED) or variable (VAR)+ by the sign bit (SIGN).

The outputs of the AND plane 53 are enabled at the inputs of the appropriate OR gates 55 using a series of two-input AND gates 57 enabled by "HIGH" level signals from the OR plane rout bits R from the Setup RAM. The "HIGH" level output of an OR gate 55 explicitly indicates the length of the anticipated Huffman code, i.e., constitutes a "one-hot" representation of the length of the currently decoded symbol.

If for a particular Huffman table, the upper AND plane element 50 is programmed to expect a 4-bit long code, the OR plane rout bit R at the input to the OR gate "4" is set "HIGH" while all of the other R bits associated with this AND plane element 50 are set "LOW". In this manner, the upper AND plane element 50 is programmed for the code length of four bits, and its output will be enabled only at the input of the OR gate "4". This selection will change when both planes are reconfigured for a different Huffman table within the same code book, however, since the AND plane element capabilities do not change with the different Huffman table selections, and thus, the range of lengths 2 to 6 will remain the same.

It can be easily seen that the OR plane 52 routing is quite simple and is largely dependent on the level of programmability designed into the AND plane 53. For example, the lower, fixed-width AND plane element 50 with a fixed-width sub-tree and a sign which is assumed to be unconditionally present, will always produce the code length of 9 and does not require any OR plane routing logic.

The lengths of FLC (Fixed Length Coded) words are introduced into the OR plane externally in the explicit ("one-hot") code via lines labelled "FLC CODE LENGTH". The AND plane 53 is only involved in decoding of the VLC (Variable Length Coded) components of the input digital video data stream, and can be turned off in the FLC mode using either E bits of the Setup RAM or additional AND gate control signals (not shown). As shown in FIG. 4, the FLC inputs do not require any routing logic. The ENABLE signal is provided to the OR plane 52 from the PVLD State Machine (see FIG. 9) to enforce a "one-hot" zero-shift output of "10000000 00000000 00000000 00000000". When the ENABLE signal is set "LOW", both VLC and FLC circuits are disabled.

Since the OR plane 52 is involved in the timing critical code length decoding loop, the explicit low-delay OR plane configuration is quite advantageous.

Figure 5:
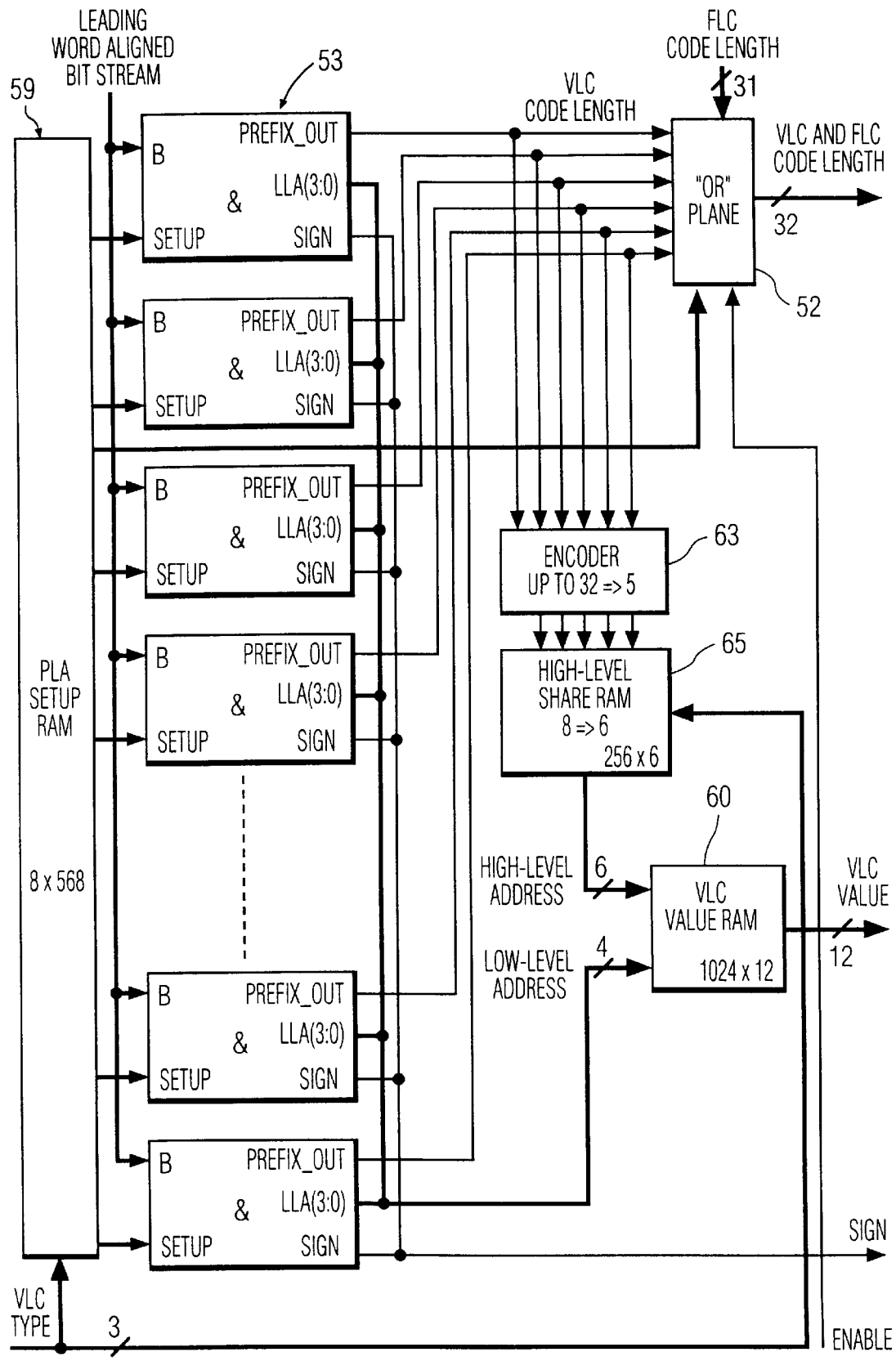
FIG. 5 is a block diagram which depicts various elements of the value and length decoding loops of the PVLD of the present invention which are utilized in the implementation of the disclosed variable length coded (VLC) data addressing scheme according to a preferred embodiment of the present invention.

A higher-level block diagram which depicts the PLA Setup RAM 59, AND plane 53, OR plane 52, and the VLC Value RAM 60, presented in FIG. 5. The Setup RAM 59 holds eight PLA setup variations (normally sufficient) selected by the VLC Type signal generated by the PVLD State Machine (see FIG. 9). It is highly desirable that the payload data, particularly AC coefficients, which normally constitute about 95% of the overall data volume, be decoded in a single clock cycle. All other data types can be allowed more time for processing. Therefore, in changing the PLA mode from one VLC type to the other, more than one clock cycle can be allowed. Once the PLA is switched to the AC coefficient mode, it does not have to switch to another mode until after a long chain of AC coefficients has been decoded at high rate. If such a long chain does not exist for a particular DCT block, the compression ratio is high, and high VLD throughput is not required for this block. This concept enables the use of slow PLA switching among different VLC and FLC data types without sacrificing the VLD performance.

The leading word aligned bit stream is applied to the programmable AND plane 53 which consists of a series of AND plane elements, as described in detail hereinabove. The four low-level address bits LLA and sign bits are multiplexed using the internal enable signals. The LLA outputs incorporate the low-level address page sharing and are applied directly to the lower address bits of the VLC Value RAM 60. The PREFIX_OUT outputs of the AND plane 53 are used in the OR plane 52 to identify the VLC code length. The FLC code length is input to the OR plane 52 separately, as described previously. The prefix outputs (up to 32, for example) of the AND plane 53 are encoded into 5 bits by an Encoder 63. A small High-Level Share RAM 65 receives at its address inputs the five bits identifying the active prefix and the currently selected VLC Type.

The High-Level Share RAM 65 is designed to reduce the address field of the VLC Value RAM 65 by performing the combined functions of low- and high-level address sharing. First, to realize the benefit of low-level sharing, the 5 bits of a prefix have to be encoded into 4 (or less if possible) bits for those VLC tables that are characterized by a large (higher than 16) number of unique prefixes. A 5=>4 VLC-Type-controlled Encoder 63 is used for this purpose. After this 5=>4 encoding, the address of the VLCValue RAM 65 can be constructed out of the 4 multiplexed low-level address bits LLA, the 4 bits derived out of the 5 prefix bits from the Encoder 63 as described above, and 3 bits which represent the VLC type, i.e., a total of 11 bits.

Figure 6:
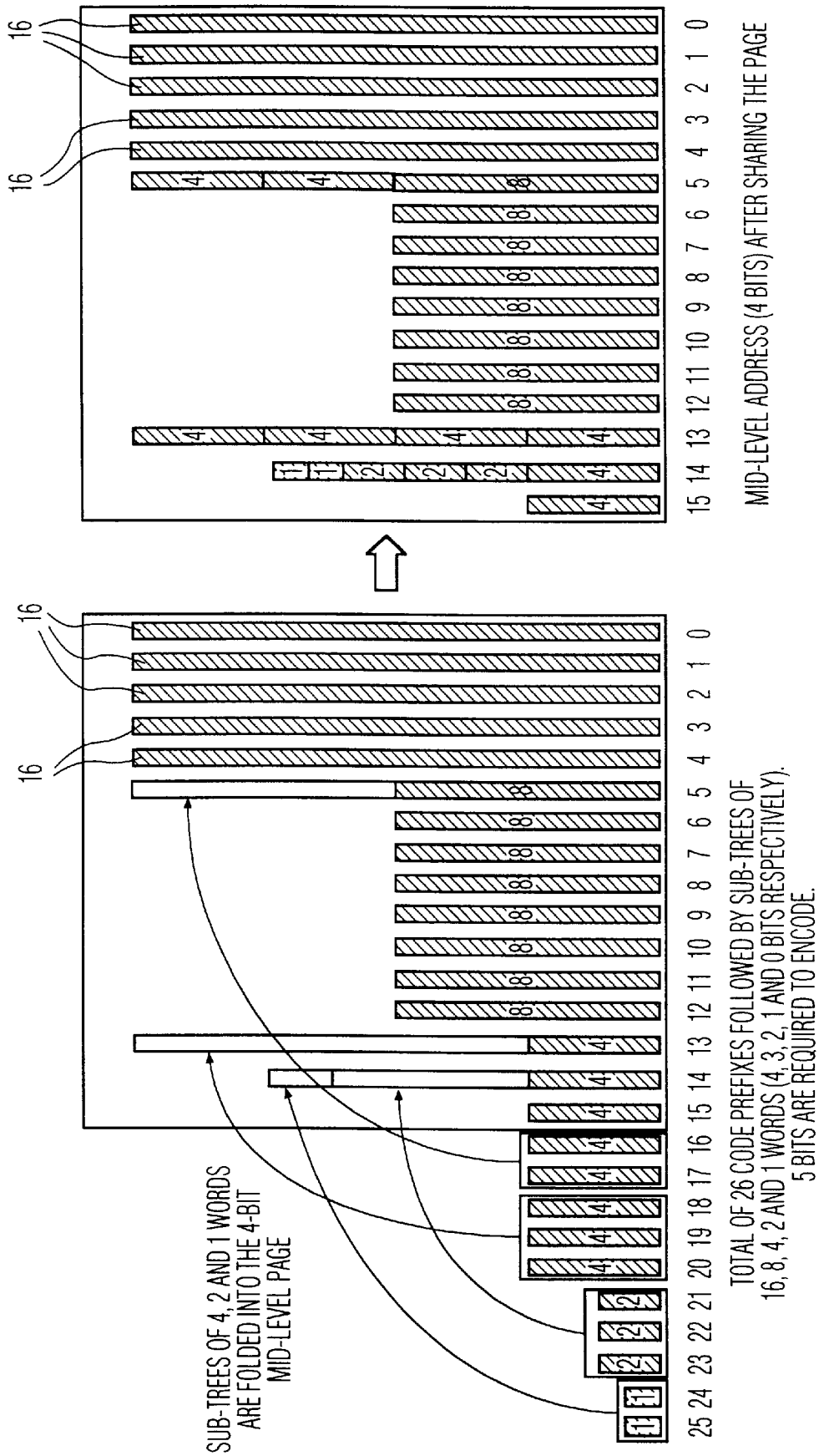
FIG. 6 is a diagram which illustrates an example of low-level page sharing and associated 5=>4 encoding according to a methodology of the present invention.

An example of low-level page sharing and associated 5=>4 encoding is shown in FIG. 6. The 26 decoded prefixes require 5 bits to address the Value RAM 60. The prefixes 16 to 25 contain sub-trees of 4, 2 and 1 words that can be easily folded into a 4-bit page. For this purpose, the prefixes 5, 13 and 14 have been selected for low-level page sharing. After sharing, the mid-level address can be expressed in 4 bits, as shown in FIG. 6.

Another function of the High-Level Share RAM 65 is to efficiently utilize the Value RAM 60 based on the observation that VLC data types require different memory resources. The largest Huffman tables are normally the AC coefficient tables. The Coded Block Pattern table of the MPEG-2 standard (termed differently in various compression standards), which identifies the presence of a pattern of blocks in the macroblock, is usually the second largest. All other Huffman tables are relatively small in comparison to these two. Some standards, such as MPEG-2, use two large Huffman tables for decoding the AC coefficients. Based on these observations, high-level page sharing can be performed by the High-Level Share RAM 65.

Figure 7:
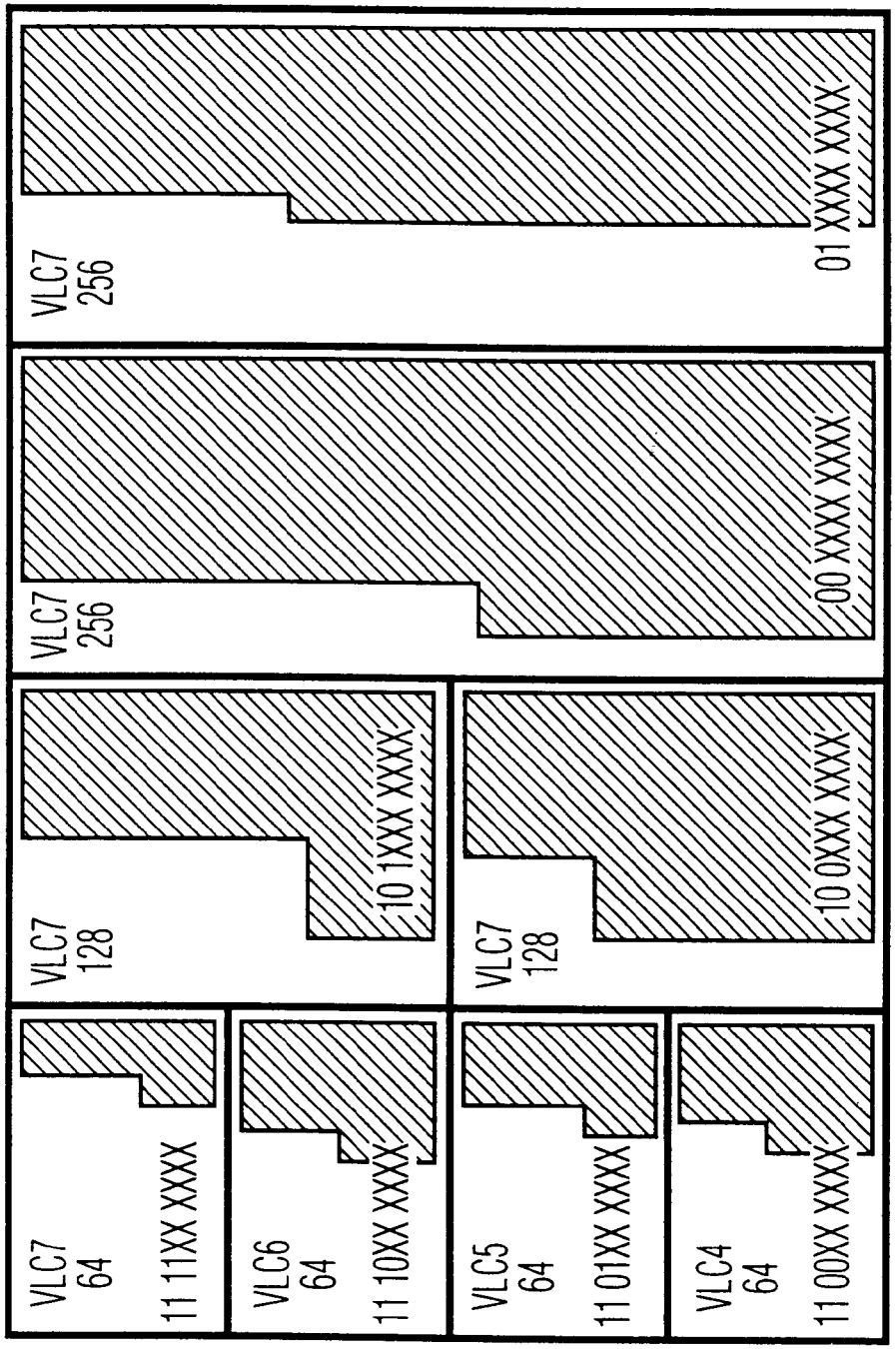
FIG. 7 is a Value RAM address mapping diagram which is used to illustrate an example of high-level Value RAM address sharing according to a methodology of the present invention.

FIG. 7 presents an example of high-level address sharing. If we assume the size of the largest VLC table to be 256 values, and we provide two such RAM areas to satisfy the most demanding standards such as MPEG-2, the remaining VLC types will have to be proportionally smaller. The Value RAM address mapping example shown in FIG. 7 additionally provides two 128-word areas and four 64-word areas. Such resources are sufficient to satisfy most current standards. To take advantage of high-level sharing, the High-Level Share RAM 65 has to effectively reduce a 3-bit VLC Type code into a 2-bit code, and, along with this, force the mid-level address bits to values shown as an example in FIG. 7 in order to organize smaller high-level pages.

Figure 8:
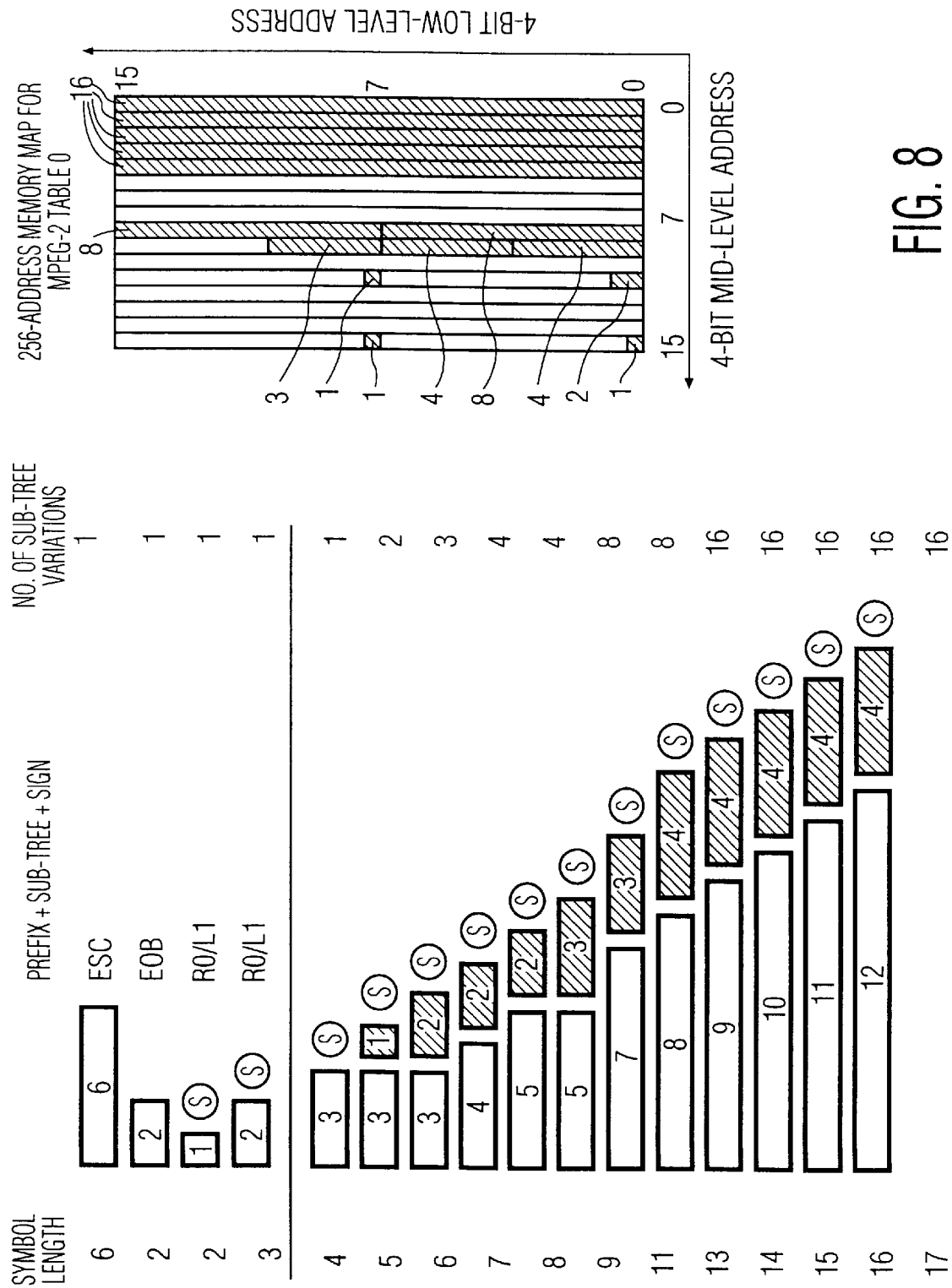
FIG. 8 is a diagram which illustrates addressing the values of MPEG-2 AC Coefficient Table 0 within the lower 256-word memory page of the Value RAM of the PVLD of an illustrative embodiment of the present invention.

FIG. 8 illustrates the fact that the allocated resources are more than adequate to satisfy the very large MPEG-2 AC coefficient Table 0. In fact, given a distribution of smaller shareable sub-trees, this table can be implemented in a 128-word page. The special cases of this table, namely the Escape code DISC), End Of Block code (EOB), and two variations of (Run=0, Level=1) code are given for consistency with the standard. Values of the ESC code and EOB code do not have to be stored in the VLC Value RAM 60.

Both mid- and high-level address modifications are performed in the High-Level Share RAM 65. The obtained benefit is a further reduction in the size of the VLC Value RAM 60 by a factor of 2. The high-level address is modified from 8 bits to 6 bits as a result of all sharing operations. The total address field of the VLC Value RAM 60 can, therefore, be reduced to 10 bits.

For AC coefficients, the Huffman tables do not include very large values. It is sufficient to use 6 bits for a "Run" value, and six bits for a "Level" value. Other VLC components generally require less bits to represent their values. Therefore, a very compact 1024×12 configuration for a Value RAM can be achieved, which is quite feasible for silicon implementations.

The size of the High-Level Share RAM 65 is 256×6, and the PLA Setup RAM 59 is estimated to have a size of 8×586. According to these estimates, the overall memory size required to implement the described PVLD functions does not exceed 18,512 bits (2.2598 Kbytes).

Figure 9:
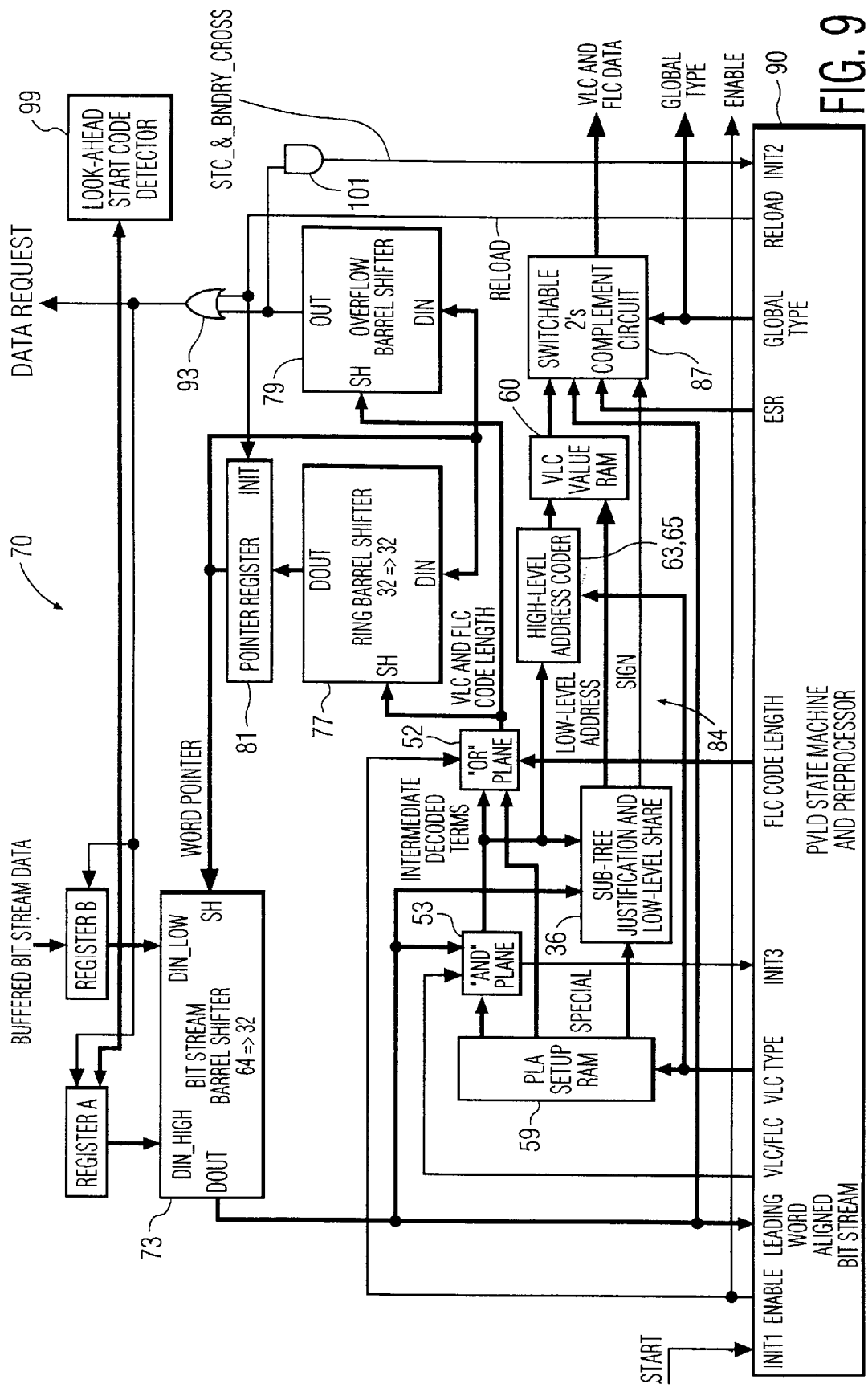
FIG. 9 is a block diagram of a PVLD constructed in accordance with a preferred embodiment of the present invention.

With reference now to FIG. 9, there can be seen a block diagram of a PVLD 70 constructed in accordance with a preferred embodiment of the present invention. The overall structure, except for the above-described circuits which provide the programmability feature, is similar to that of the "one-hot" VLD disclosed in U.S. Pat. No. 5,650,905 and U.S. Ser. No. 08/671,891.

The PVLD 70 includes two Registers A and B which are updated with a fixed-size buffered bit stream data segment at the PVLD's request, and a Bit Stream Barrel Shifter 73 that provides an output decoding window having a bit width equal to the maximum-length code word (i.e., 32). The Bit Stream Barrel Shifter 73 shifts its decoding window across a sequence of available input bits as each code word is detected. The decoding window is shifted by the number of bits corresponding to the length of the last decoded code word. The accumulating circuit comprised of a Ring Barrel Shifter 77, an Overflow Barrel Shifter 79, and a Pointer Register 81, is used to point to a new word in the bit stream based on the accumulated sum of previously decoded code lengths. The overflow condition of the accumulating circuit is detected in the Overflow Barrel Shifter 79, resulting in the activation of the Data Request signal, which causes updating of the Registers A and B. A value decoding circuit 84 comprised of the Sub-Tree Justification and Low-Level Share circuit 36, the High-Level Address Coder (63, 65), the VLC Value RAM 60, and a Switchable 2's Complement Circuit 87, decodes values associated with the detected code words. A PVLD State Machine 90 (and Preprocessor) are used to monitor the decoding process.

The PVLD operation is initiated by a START signal applied externally to the State Machine 90. This signal forces the State Machine 90 into a first one of a plurality of prescribed initialization states, by means of a hardware preset. The PVLD 70 starts looking for start codes by issuing a RELOAD signal which initializes the Pointer Register 81, which, in turn, activates the Data Request signal and causes bit stream segments from Register B to Register A, and from memory to Register B. An OR gate 93 can be used for this purpose, although this is of course not limiting to the present invention. In order not to increase the overall critical path, the described functionality can be easily incorporated into the non-critical path (DIN to DOUT) of the Overflow Barrel Shifter 79.

In order to further simplify the State Machine 90, a Look-Ahead Start Code Detector 99 is used to constantly monitor the contents of Register B for the presence of a start code. If a start code is detected in Register B, both inputs of an AND gate 101 will be "HIGH" when the overflow output of the accumulating circuit is generated, thereby causing the output of the AND gate 101 (the STC_&_BNDRY_ CROSS signal) to be driven "HIGH", thereby ultimately forcing the State Machine 90 into a second one of its prescribed initialization states, by means of a hardware preset. In response to the STC_&_BNDRY_CROSS signal, the State Machine 90 issues a RELOAD signal. This hardware preset is particularly useful in situations where the bit stream is interrupted due to start code alignment. It is preferable in this architecture to use 32-bit aligned start codes.

A fully masked AND gate (not separately shown) is provided in the AND plane 53 to respond to special situations while decoding of the bit stream is taking place. The output SPECIAL of the AND plane 53 can be used in the State Machine 90 as a hardwired preset signal to place the State Machine 90 into a selected one of several possible states, depending on which of several possible current states the State Machine 90 is in. This feature is particularly useful for monitoring special signals such as End of Block (EOB), Escape (ESC), and others whose presence affects the decoding algorithm.

The PVLD 70 is dynamically stalled and enabled by the ENABLE output of the State Machine 90. This signal can enforce a zero-shift code length at the inputs of the Ring and Overflow Barrel Shifters 77 and 79, respectively, thereby resulting in stalling the Word Pointer value when extra clock cycles of processing are required without parsing the bit stream. The ENABLE signal is also used to validate the PVLD output data.

The PVLD State Machine 90 controls the decoding process by means of selecting global data types (VLC and FLC) and providing this information to both length and value decoding sections. The VLC data type is provided as a separate address to the Setup RAM 59. Based on the VLC data type, the Setup RAM 59 reconfigures the AND plane 53, the OR plane 52, and the Sub-Tree Justification and Low-Level Share circuit 36.

In the preferred embodiment, the decoding process is optimized in favor of maximizing the speed of decoding payload information such as AC coefficients. As discussed hereinabove, the Setup RAM 59, due to its inherent speed limitations, is allowed to reconfigure the above circuits for more than a single clock cycle, if necessary, without significantly sacrificing the VLD performance. Once the circuits are configured for a particular VLC type, the decoding process can be performed at a fast rate.

The AND plane configuration is optimized based on a compromise between the allowable resources and the level of flexibility needed to satisfy as many compression standards as is desired. Unknown future standards will require a higher level of flexibility, which flexibility is allowed by this PVLD architecture.

The intermediate decoded terms from the output of the AND plane 53 are used to decode the word lengths in the OR plane 52 as well as to construct a compact address to the VLC Value RAM 60. The Sub-Tree Justification and Low-Level Share circuit 36 configures the variable length coded sub-tree and sign bits and provides a flexible means of sharing a low-level address page among various sub-trees in the structure. The High-Level Address Coder (63, 65) is used to reduce the address field of the VLC Value RAM 60 due to low-level page sharing. It is also used to further reduce the address field of the VLC Value RAM 60 by configuring variable-size high-level pages of this RAM based on the wide variation in the sizes of the Huffman tables of various VLC components. A great level of flexibility is provided both in low- and high-level page sharing.

When a VLC data type is selected by the PVLD State Machine 90, the Global Type signal applied to the Switchable 2's Complement Circuit 87 connects the output of the VLC Value RAM 60 to the PVLD data output. The 2's complement representations for those VLC data types that require this operation are selectively obtained under the control of the Global Type signal. At the same time, the VLC/FLC output of the PVLD State Machine 90 turns on the AND plane outputs, and the FLC Code Length Signal is reset internally in the PVLD State Machine 90.

The FLC data generally do not require any interpretation and can be copied to the PVLD output directly from the bit stream. When an FLC data type is selected by the State Machine 90, the Global Type signal applied to one of the inputs of the Switchable 2's Complement Circuit 87 connects the output of this circuit directly to its bit stream input. At the same time, the FLC Code Length output of the State Machine 90 is applied to the OR Plane 52, and the VLC/FLC output of the State Machine 90 turns off the AND plane outputs.

If required, the State Machine 90 can operate in a tree searching mode to decode such data types as macroblock pattern and type. Components such as macroblock type may have a large number of small VLC sub-tables that could substantially increase the number of VLC types in the system, leading to higher memory utilization. In order to keep the number of VLC types to a minimum (e.g., 8), the State Machine 90 is provided with the capability of applying the values decoded in the tree searching mode to the Switchable 2's Complement Circuit 87 via the ESR lines. In these situations, the bit length of the VLC word is introduced to the OR plane 52 via the FLC CODE LENGTH lines.

A State Machine with optimum speed of processing is generally achieved by using a RAM of the smallest possible size in a feedback loop of a state register. The problem with this approach, on the other hand, is that any single bit of a variable other than a state variable itself doubles the size of this RAM by a factor of two when applied to the address bus of this RAM. The problem once again has been resolved as a compromise among the speed of processing of critical and less critical components of compression protocols. The State Machine 90 has been optimized in favor of fast processing of the AC coefficients, although this should not be considered limiting to the present invention, in its broadest sense.

Figure 10:
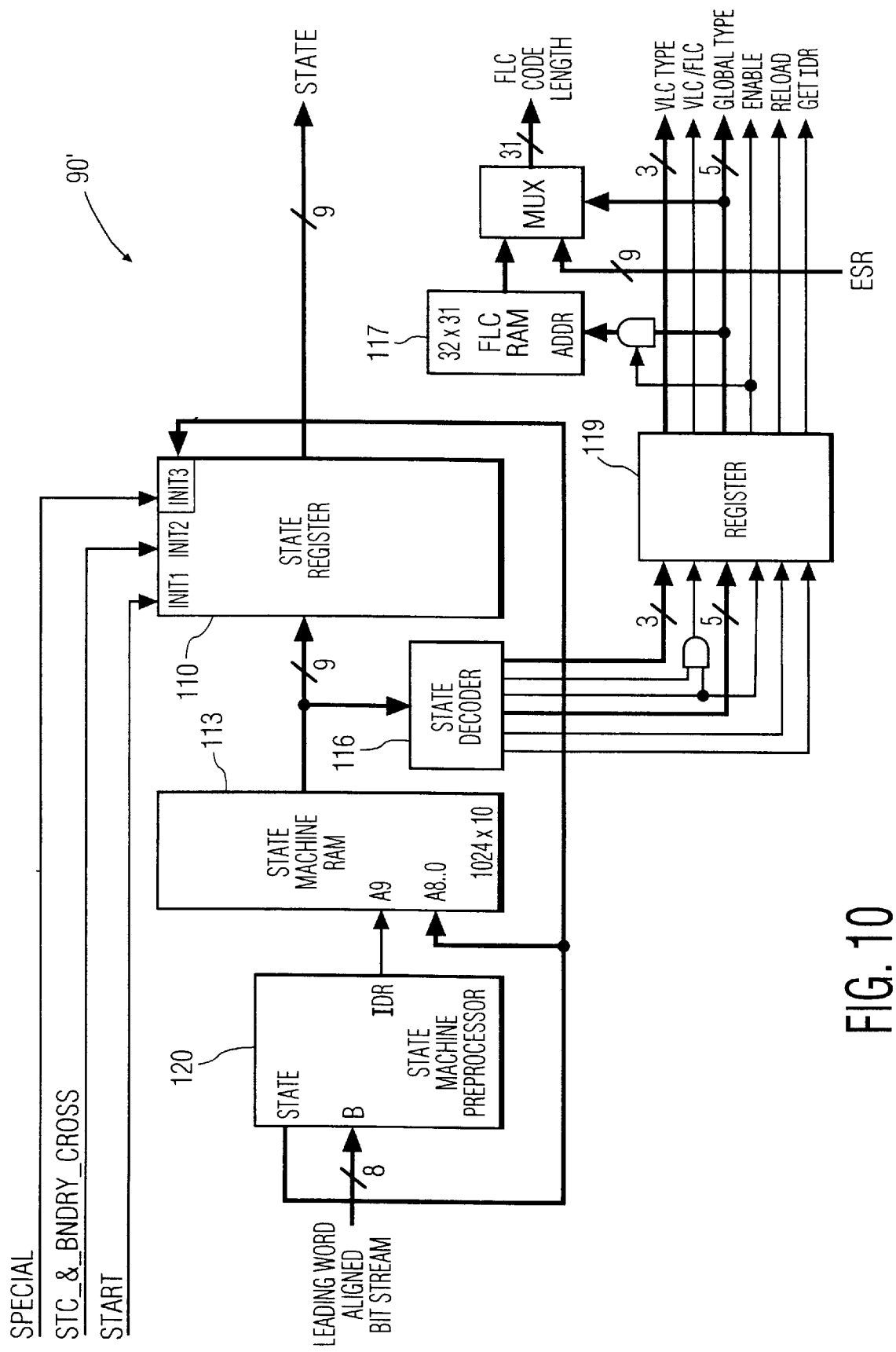
FIG. 10 is a block diagram of a PVLD State Machine constructed in accordance with a preferred embodiment of the present invention.

With reference now to FIG. 10, there can be seen a block diagram of a PVLD State Machine 90' constructed in accordance with a preferred embodiment of the present invention. The PVLD State Machine 90' includes a 9-bit State Register 110 which has two hardware presets, INIT1 and INIT2 which are used to reduce the amount of transfer logic for the most common "watch-dog" situations.

The State Machine 90' is put into a predetermined state by a START signal (applied to the input INIT1) which can be a macroslice sync (a signal indicating the beginning of a full horizontal raster of slices), a vertical sync or any other command from the processor to start the decoding operations. A macroslice sync is a preferred START signal in terms of simplicity of PVLD implementation.

The PVLD logic can be substantially simplified with 32-bit start code alignment. It is assumed in this design that the start codes are 32-bit aligned and can only appear as a full bit stream segment in registers B and A. The Look-Ahead Start Code Detector 99 (FIG. 9) detects the presence of a start code prior to its appearance in Register A. For "cleaner" PVLD synchronization in situations where a non-meaningful trailing portion of a bit stream segment before a start code is to be discarded (trailing end of the last bit stream segment in a slice, bit stream errors), a useful logical combination of a Start Code Detector output (STC) and a "boundary cross" signal (BNDRY_CROSS) from the output of the Overflow Barrel Shifter 79 is used to initialize the State Register 110 (via input INIT2) into its second predetermined intitialization state. The PVLD State Machine 90' is preferably designed to constantly watch for such condition in all of its states.

It is highly recommended to reset to all zeros the trailing ends of all bit stream segments followed by start codes. In handling undetected errors, the truncated portion of the last word combined with the leading bits of a start code can generate an "illegal" recognizable symbol which will not be allowed to be erroneously decoded since the boundary cross signal will be generated along with the start code indication.

Special situations such as occurrences of End of Block (EOB) and Escape (ESC) codes have to be monitored while decoding the bit stream components. Several special states of the State Machine 90' can be dedicated to these situations. The AND plane output SPECLAL serves as a hard-wired PVLD State Machine preset into a selected one of several possible states, depending upon which of several current states is detected. Such predetermined states as "Start of Block Decoding" or "Go to Non-Huffman Mode" can be assigned ahead of time, and simple hard-wired logic can be used to preset the State Machine 90' into those states when triggered by signal SPECIAL at the input INIT3 of the State Register 110. This hard-wired initialization scheme can substantially reduce the complexity of the State Machine 90'.

In order to reduce the size of a State Machine RAM 113, all intermediate decoding results (IDR) are introduced into this RAM via a single address input A9. A group of predetermined states is interpreted as PVLD control signals by a hard-wired State Decoder 116 whose outputs are registered by the Register 119 and and aligned in time with the State Register 110. These signals whose functions have been previously described are VLC TYPE, VLC/FLC, GLOBAL TYPE, ENABLE and RELOAD.

The FLC Code Length signal is generated by the FLC RAM 117 whose address lines are controlled by the GLOBAL TYPE signal. The FLC RAM address lines are reset to zeroes when the ENABLE signal is not active. The FLC CODE LENGTH in this case should read all zeros. The ENABLE signal also disables the VLC/FLC signal which, in turn, disables the PLA's AND outputs. A 9-bit ESR signal is multiplexed with the leading 9 bits of the FLC RAM outputs in order to set the bit length of VLC symbols decoded in the tree searching mode if desired.

Figure 11:
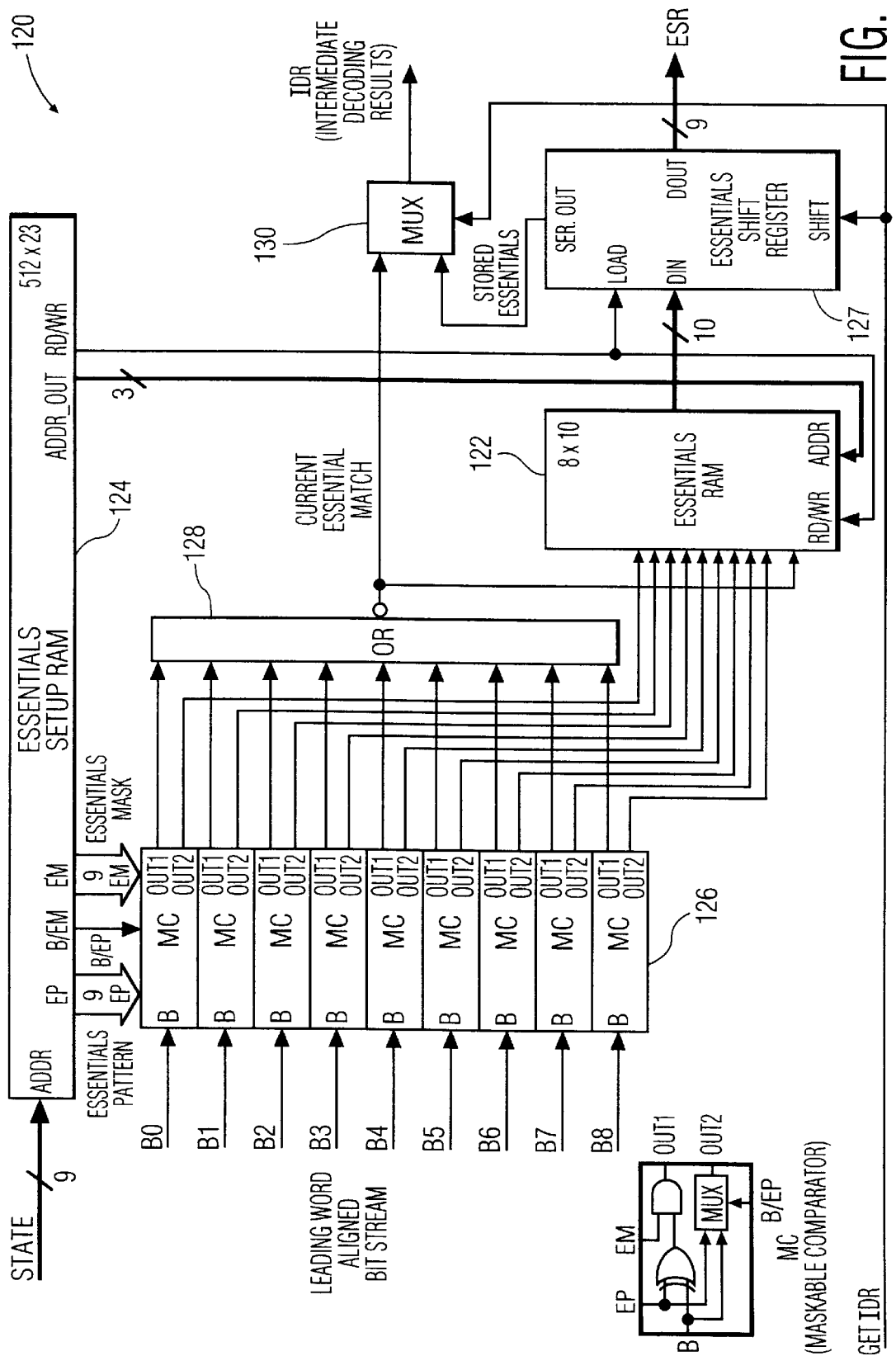
FIG. 11 is a block diagram of a PVLD State Machine Preprocessor constructed in accordance with a preferred embodiment of the present invention.

A PVLD State Machine Preprocessor 120 depicted in FIG. 11 is provided to introduce the Intermediate Decoding Results (IDR) into the State Machine 90'. Only the essential decoding parameters influencing the decoding algorithm of the State Machine 90' are extracted from the bit stream and are presented to the State Machine 90' via the IDR line.

The IDR data can be presented to the State Machine 90' as current or stored essentials. The current essentials such as an EOB (End of Block) code are constantly monitored by the State Machine 90' in order to terminate the decoding of a DCT block while the AC coefficients are being decoded. The stored essentials such as macroblock pattern or type data are decoded and stored in an Essentials RAM 122 to be used later in the decoding algorithm.

Current essentials are available to the State Machine 90' at the same time in two different ways. The essentials recognized by the SPECIAL signal are capable of forcing a transition of the State Machine 90' into a selected one of several predetermined initialization states, depending upon the current state of the State Machine 90'. The essentials can also be recognized in a more versatile way by using an Essentials Setup RAM 124, an array of Maskable Comparators 126, and an OR gate 128.

The Essentials Setup RAM 124 controlled by the State Machine's STATE output stores a variety of essential patterns and masks. These patterns are compared to the leading 9 bits of the bit stream by the array of Maskable Comparators 126. Since these patterns have variable length, an ESSENTIALS MASK signal is used to mask meaningless bits of the ESSENTIALS PATTERN. The CURRENT ESSENTIAL MATCH signal will be set "HIGH" if all the MC outputs OUT1 are "LOW" indicating that in the current state an anticipated condition is met. The multiplexer 130 carries this signal to the State Machine 90' as long as the GET IDR signal is not active.

This technique can be efficiently used, for example, in fast decoding of AC coefficients. While the coefficients are decoded, the State Machine 90' can monitor the presence of the End of Block code at the CURRENT ESSENTIAL MATCH output. At the same time, a non-Huffman mode is monitored by the SPECIAL signal which, when present, will indicate the occurrence of the Escape code and will transition the State Machine 90' into the appropriate predetermined state by means of a hard-wired preset. Monitoring more than two current matches (the equivalent of IF statements in the state machine descriptions) other than those described will require a sequence of states.

The Essentials RAM 122 can store a CURRENT ESSENTIAL MATCH value, a 9-bit segment of a bit stream or a pattern stored in the Essentials Setup RAM 124 for further use by the State Machine 90'. A bit multiplexer MUX in a Maskable Comparator MC switches the output OUT2 of MC between the bit stream and the ESSENTIAL PATTERN. This multiplexer is controlled by the B/EP output of the Essentials Setup RAM 124. The Essentials RAM 122 is always in the read or write mode which is controlled by the RD/WR signal. Both the address and the read/write mode of operation are controlled by the Essentials Setup RAM 124. In states which do not require these operations, a write operation to a zero address is performed. The data in this address location can be used with special care.

When the Essentials RAM data are needed by the State Machine 90', the RAM 124 is read, and its data are loaded into an Essentials Shift Register 127. The State Machine 90' may require either the flags contained in the bit stream or the patterns originally stored in the Essentials Setup RAM 124. These patterns may be needed for various applications, such as organizing a small counter, setting a bit length, etc. The STORED ESSENTIALS are transferred to the State Machine 90' sequentially via the multiplexer MUX. The sequential readout of the Essentials Shift Register 127 and the switching of the MUX are controlled by the GET IDR signal.

The parallel output ESR of the Essentials Shift Register 127 is available to the PVLD value and length decoding sections in order to convey the bit width and value of some components decoded in tree searching mode.

The total memory size required to implement the State Machine 90' circuits including the Preprocessor 120 does not exceed 22,064 bits or 2.6934 Kbytes. The total PVLD memory utilization is, therefore, equal to 2.2598+2.6934= 4.9532 Kbytes.

The information affecting the State Machine algorithm can be Huffman encoded. In these situations the undecoded bits of the bit stream are meaningless to the State Machine 90'. Examples of such data are macroblock pattern and type. Even though the decoded data will be available at the PVLD pipelined value path somewhat later, they will not necessarily be in the form the State Machine 90' needs. For instance, the decoded macroblock pattern will express a pattern of blocks in a macroblock, but what the State Machine 90' really needs is a number of blocks in order to terminate a macroblock. For this reason the State Machine 90' architecture is preferably designed to accommodate a tree searching mode—a mode in which a bit-by-bit search is performed in order to arrive at the decoding result.

There are two methods to implement the tree searching mode. In one of them, both EP and EM inputs of the array of Maskable Comparators 126 are set "HIGH" for a tested bit. The pattern slides in consecutive states from the leading bit on, with the IDR bit routing the State Machine 90' until the leaf of the tree is reached. A state reached in this fashion can be interpreted in many ways. Another method is to store a bit stream segment in the Essentials RAM 122, reload the pattern into the Essentials Shift Register 127 when needed, and activate the GET IDR signal to make the symbol bits available to the State Machine 90' sequentially. If the number of VLC data types is higher than 8, code values and bit lengths of the components decoded in the tree searching mode can be made available to the decoding circuits through the output ESR of the Essentials Shift Register 127. The tree searching decoding mode is not required and should not be used when processing DCT blocks.

Figure 12:
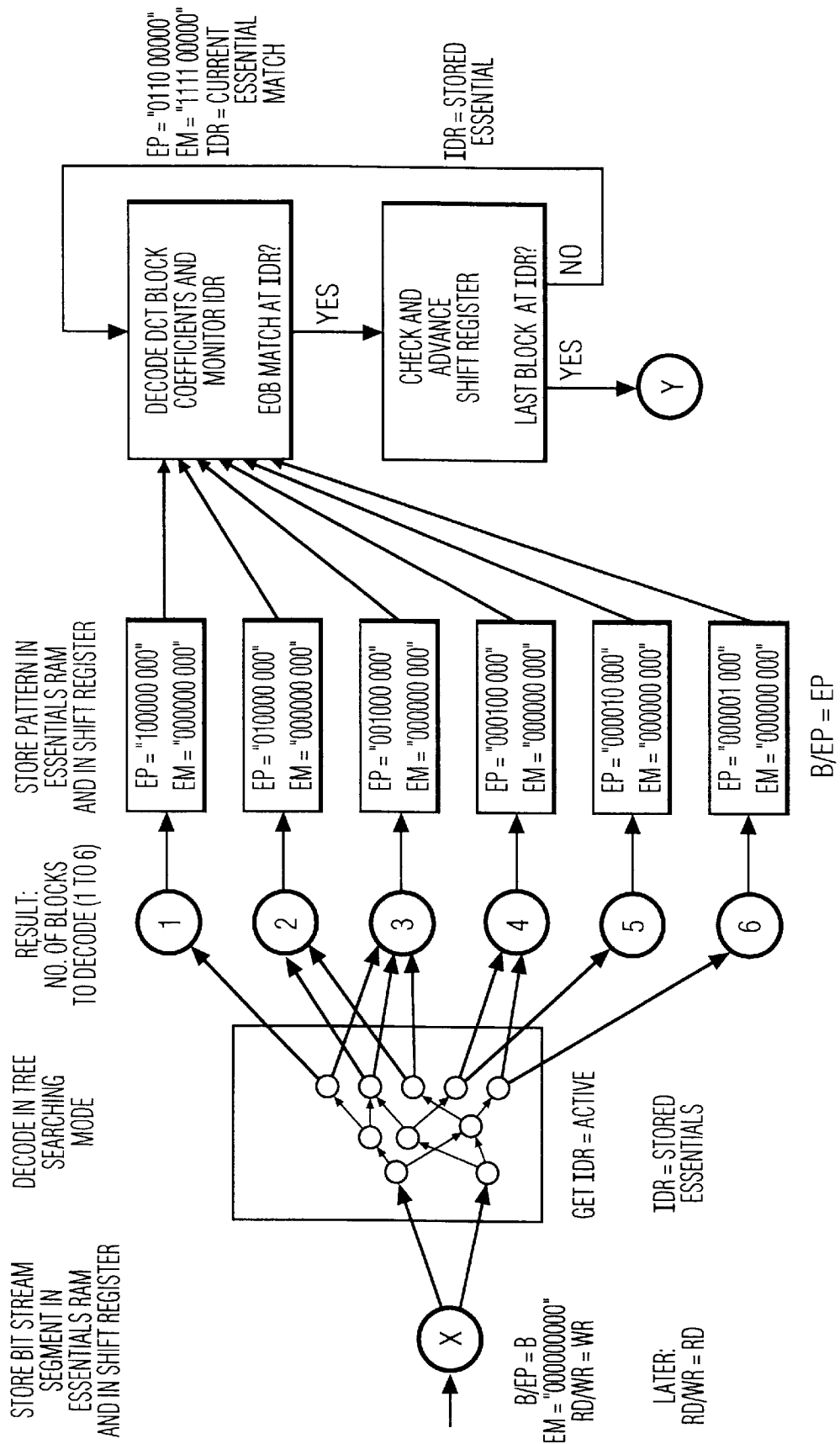
FIG. 12 is a diagram which illustrates an example of using intermediate decoding results (IDR) in a a single-bit representation for advancing the PVLD State Machine depicted in FIG. 10 while decoding a macroblock pattern and DCT blocks.

An example of using a single-bit IDR for advancing the PVLD State Machine 90 while decoding a macroblock pattern and DCT blocks is depicted in FIG. 12. At states X, the State Machine 90' enters the tree searching mode to decode a macroblock pattern. The 9-bit segment containing the macroblock pattern bit stream is written into the Essentials RAM 122. When decoding of this bit stream is required, the segment is loaded into the Essentials Shift Register 127 and read out sequentially by activating the GET IDR signal.

After testing bits in the tree searching mode, the State Machine 90' arrives at one of six states, 1 to 6 (in 4:2:0 mode), corresponding to six possibilities of the total number of blocks in a macroblock. One of six patterns depicted in FIG. 12 is then stored in the Essentials RAM 122 by means of switching the multiplexers in the Maskable Comparator array 126 to the patterns stored in the Essentials Setup RAM 124, using the B/EP signal.

In the process of block decoding, the ESSENTIALS PATTERN and ESSENTIALS MASK are set to monitor the End of Block signal ("0110" in this example), with the IDR output repeating the CURRENT ESSENTIAL MATCH signal. When the EOB match occurs, the Essentials Shift Register 127 is advanced by the Get IDR signal, and the current bit of the written pattern is tested. The process is repeated until all blocks have been decoded.

The State Machine 90' and Preprocessor 120 are designed to minimize the required amount of PVLD memory. Further, using the three types of hard-wired presets described above helps to reduce the State Machine transition logic.

Multiple dedicated states are to be assigned for key operations, such as Types with Enable and Types without Enable, multiple states where GET IDR is to be active in the tree searching and other modes of operation. The RELOAD operation does not have to be associated with multiple states because it always leads to the same result—resynchronization by a start code.

The number of State Machine states has been deliberately exaggerated to accommodate multi-cycle operations such as sequential execution of IF-type operations when necessary or the tree searching mode operations. For comparison, the PVLD State Machine 90' has 512 states, while the dedicated MPEG-2 state machine can be implemented using 35 to 40 states. This does not include a substantial amount of auxiliary logic.

The specific PLA structure disclosed herein is optimized for MPEG-2, H.261 and DVC compression standards. This PLA structure may also be suitable for many other compression standards. For this reason, strict PLA optimization for the above compression standards was not necessary. In fact, adding more logic resources is highly recommended. The design supports up to 32 prefix variations with only 24 used.

The associated VLC table structures for MPEG-2, H.261 and DVC are presented in FIGS. 13–28. The optimized PLA specifications are presented in FIG. 29 for the AND plane 53, and FIG. 30 for the OR plane 52. The resulting AND plane consists of 24 partially masked AND plane elements of various configurations. A single-bit input must be added to every AND element in the PLA to accommodate the VLC/FLC signal.

According to the provided PLA configuration, the PLA Setup RAM 59 of FIG. 5 will have to provide 243 lines to configure the polarity (P) and mask (M) inputs of the AND plane gates 25 of FIG. 3, 163 lines to configure the sub-tree justify (TJ) and low-level share (S) inputs of the low-level address page sharing section of FIG. 3, and 180 lines to configure the rout (R) inputs of the OR plane 52. The total required data output width of the PLA Setup RAM 59 is, therefore, 586 bits. This number can be potentially reduced on the assumption that a certain number of sub-trees cannot be shared or would have limited sharing capability. A tighter PLA optimization can also bring this number down. With these reductions it is safe to assume that the PLA Setup RAM 59 can be configured as 8×512.

Figure 31B:
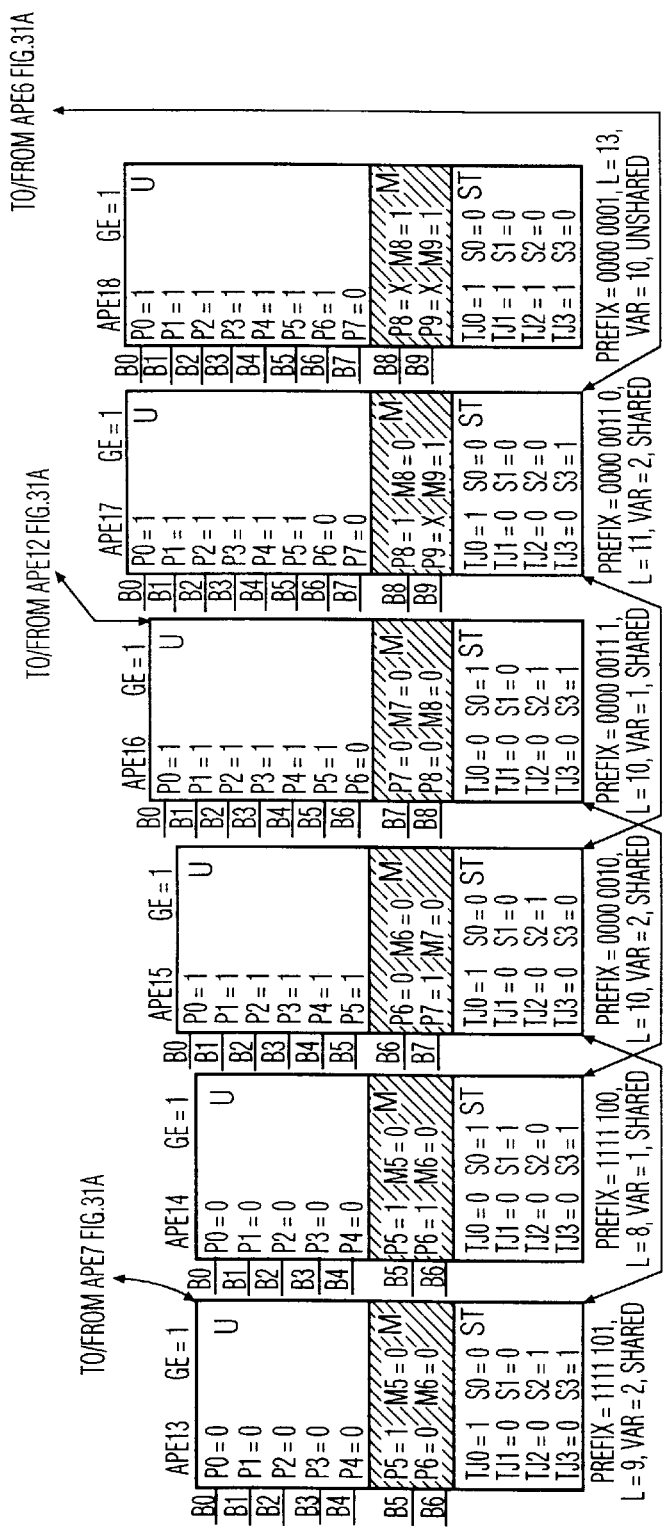
FIG. 31 is a diagram which illustrates an AND plane software realization for MPEG-2 AC Coefficient Table 1; and, FIG. 32 is a diagram which illustrates an AND plane software realization for DVC AC Coefficient Table.
Figure 31C:
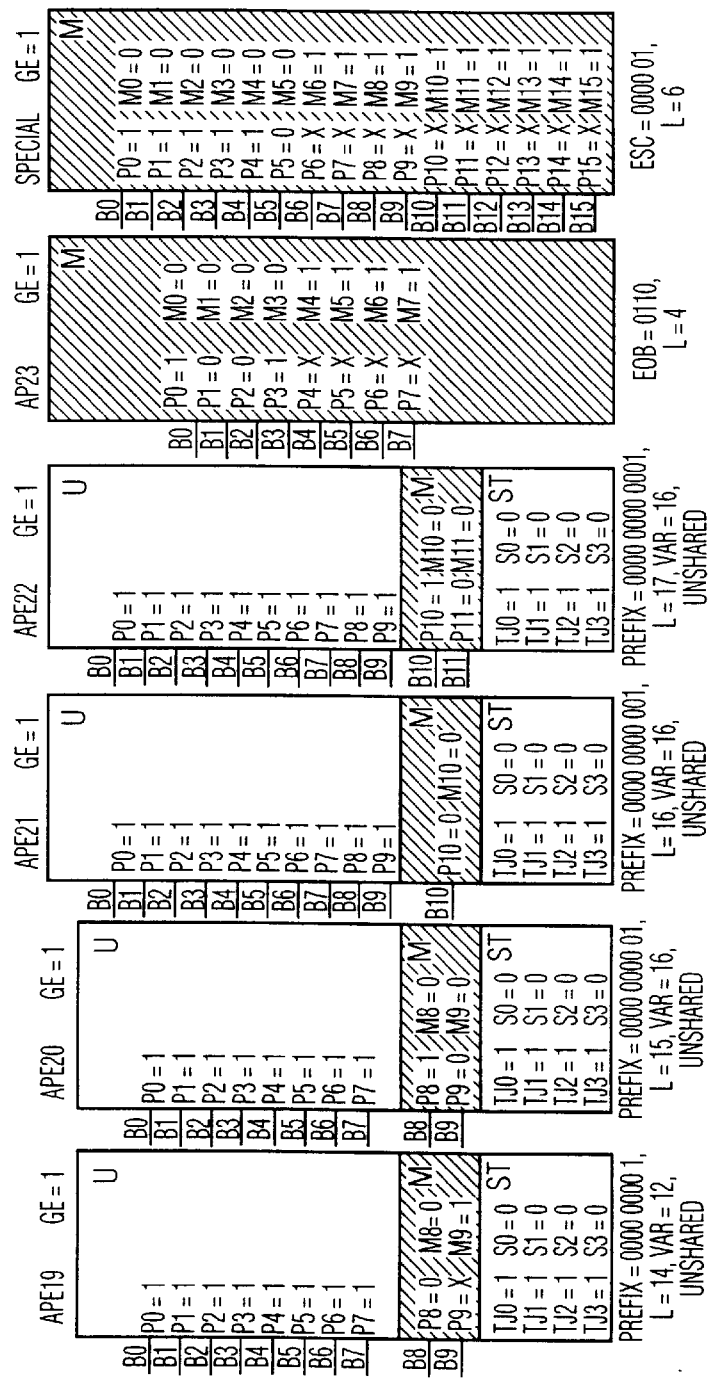
Figure 32B:
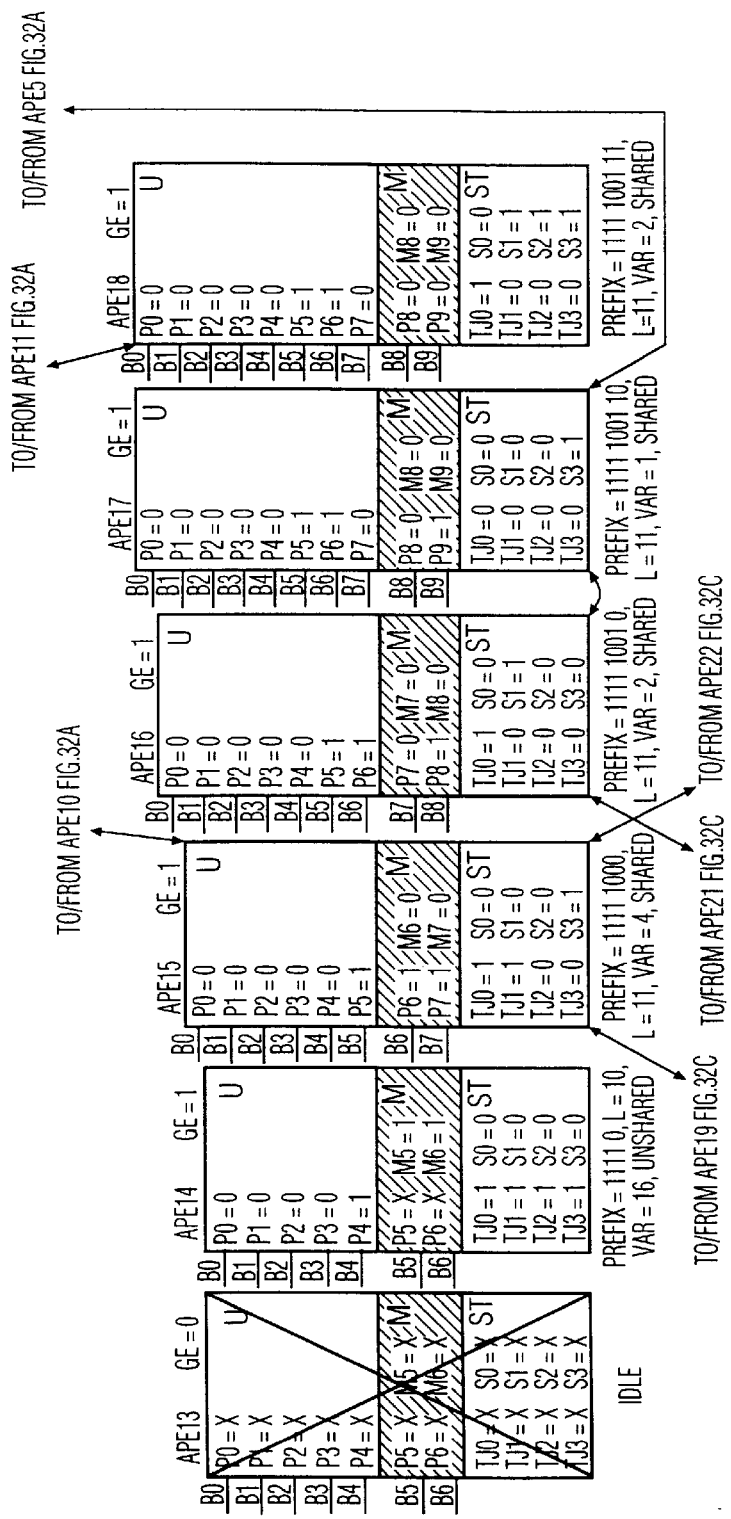
Figure 32C:
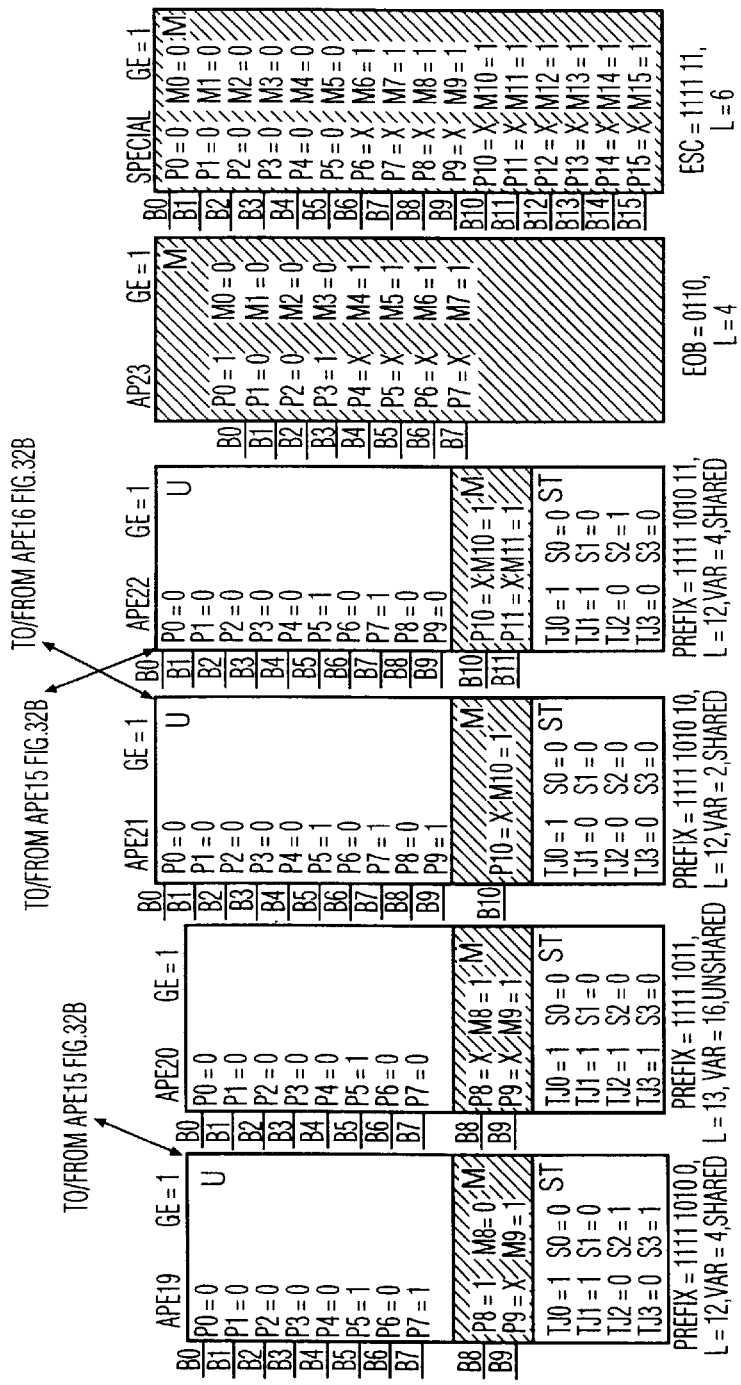

Two practical examples of AND plane software realization are presented in FIGS. 31–32 for a very large MPEG-2 AC Coefficient Table 1 and a DVC AC Coefficient Table, respectively. The optimized AND plane configuration presented in FIG. 33 is used as a basis for these examples.

The software setup flags for the AND plane elements APE1 to APE24 are shown for three distinctive areas—U (unmasked), M (masked) and ST (sub-tree) of these elements. The links between the AND plane elements represent grouping for low-level address page sharing. The owners of a dominant prefix within each group are generally assigned to the product term having the largest number of sub-tree variations, or, otherwise, are selected at random for the purpose of further low-level page address generation.

These particular designs have produced excellent results (even better than the expectations mentioned hereinabove, i.e., 5-to-3 encoding of the prefixes has been achieved rather than the 5- to -4 encoding described hereinabove). More particularly, 22 product terms for Huffman symbols associated with value decoding have been folded into a total of 8 (rather than up to 16) low-level pages in the first example. In the second example, 19 product terms have been folded into 6 low-level pages.

If similar results can be achieved for all the tables considered for a particular design, the low-level page address field will be reduced from 4 to 3 bits, which will translate into further Value RAM size reduction by a factor of two (savings of 0.75 Kbytes). On the other hand, rather than electing to save this memory, it may be preferable to utilize this memory to provide the flexibility to decode data coded in accordance with future compression standards that may require this memory.

The PVLD of the present invention as described hereinabove is performance-optimized to allow for a higher throughput of the AC coefficient data in comparison to other data types. However, this is not limiting to the present invention, in its broadest sense. The architecture of the PVLD of the present invention incorporates several novel concepts, such as a programmable AND/OR plane PLA, a variable length coding (VLC) data addressing scheme with address page sharing, and a universal single-bit-driven state machine with preprocessor capable of controlling the VLD in both parallel and tree searching modes of operation, each of which are believed to constitute separate and distinct inventions in their own right. Further, the PVLD of the present invention may be implemented as a suitable hardware accelerator block of a Philips Semiconductors Trimedia or other media processor with which it is integrated, or may be implemented as a standalone device. The total RAM utilization in the preferred embodiment described in detail hereinabove is 4.9532 Kbytes, not including the 0.75 Kbyte memory saving mentioned above.

Although various illustrative and preferred embodiments of the present invention have been described in detail hereinabove, it should be clearly understood that many variations and/or modifications of the basic inventive concepts taught herein which may appear to those skilled in the pertinent art will still fall within the spirit and scope of the present invention as defined in the appended claims.

What is claimed is:

1. A variable length decoder for decoding an input digital data stream which includes a plurality of variable length code words which are coded in accordance with any of a plurality of different coding standards, including:

an input circuit which receives the input digital data stream and produces a decoding window that includes a leading word aligned bit stream; and, a decoding circuit which is configurable into any selected one of a plurality of different decoding configurations, depending upon which coding standard the input digital data stream is coded in accordance with, the decoding circuit being coupled to the leading word aligned bit stream for decoding the length and value of each word in the input digital data stream.

2. The variable length decoder as set forth in claim 1, further including a programmable controller for controlling the operation of the variable length decoder, in accordance with any of a plurality of different decoding protocols, depending upon which coding standard the input digital data stream is coded in accordance with.

3. The variable length decoder as set forth in claim 2, wherein the programmable controller determines which coding standard the input digital data stream is coded in accordance with, and automatically configures the decoding circuit into the decoding configuration which is appropriate for decoding the input digital data stream.

4. The variable length decoder as set forth in claim 3, wherein the decoding circuit includes a programmable logic array.

5. The variable length decoder as set forth in claim 4, wherein the programmable logic array includes a plurality of first logic gates, at least a plurality of which are each selectively maskable.

6. The variable length decoder as set forth in claim 5, wherein the programmable logic array further includes a plurality of second logic gates, at least a plurality of which are programmable for selectively routing outputs of the first logic gates to an output line.

7. The variable length decoder as set forth in claim 6, wherein the first logic gates comprise AND gates, and the second logic gates comprise OR gates having inputs which are selectively coupled to outputs of the AND gates.

8. The variable length decoder as set forth in claim 4, wherein the programmable logic array includes:

an AND plane having inputs coupled to the leading word aligned bit stream;

an OR plane having inputs coupled to outputs of the AND plane; and, wherein each of the AND plane elements includes an AND gate;

wherein the AND gates of at least a plurality of the AND plane elements have selectively variable-width inputs.

9. The variable length decoder as set forth in claim 8, wherein:

at least one type of the code words of the input digital data stream include code prefixes; and, each of a plurality of different groups of the code words of the at least one type have different code prefixes but are of the same bit length.

10. The variable length decoder as set forth in claim 9, wherein each of the AND plane elements which has an AND gate having selectively variable-width inputs further includes a programming circuit which programs the AND gate of that AND plane element to detect a different respective one of the code prefixes.

11. The variable length decoder as set forth in claim 10, wherein only the output of the AND gate which detects the code prefix of the leading code word in the leading code word aligned bit stream is at a logic high level.

12. The variable length decoder as set forth in claim 11, wherein the OR plane includes:

a plurality of OR gates each having at least one input; and, a routing circuit which routs the outputs of the AND gates which are programmed to detect code prefixes which belong to code words having the same bit length to the inputs of the same OR gate.

13. The variable length decoder as set forth in claim 12, wherein the routing circuit is programmable by the controller into a plurality of different routing configurations, depending upon which coding standard the input digital data stream is coded in accordance with.

14. The variable length decoder as set forth in claim 13, wherein only the output of the OR gate which receives at one of its inputs a logic high level AND gate output is at a logic high level, and constitutes a one-hot data representation of the bit length of the leading word in the leading word aligned bit stream.

15. The variable length decoder as set forth in claim 10, wherein each AND gate which has selectively variable-width inputs has M maskable inputs and U unmaskable inputs, wherein M>0; U>0; and, M+U=N, where N is the total number of inputs to the AND gate.

16. The variable length decoder as set forth in claim 15, wherein the programming circuit of each AND plane element which includes an AND gate having selectively variable-width inputs includes:

U first logic cells coupled between a respective bit of the leading code word in the leading word aligned bit stream and a respective unmaskable input of the associated AND gate; and, M second logic cells coupled between a respective bit of the leading code word in the leading word aligned bit stream and a respective maskable input of the associated AND gate, wherein each second logic cell has a mask control input coupled to a respective mask control bit having high and low logic levels, whereby the second logic cell selectively masks the respective maskable input of the associated AND gate, depending upon the logic level of the respective mask control bit.

17. The variable length decoder as set forth in claim 16, wherein each of the first and second logic cells further includes a polarity control input coupled to a respective polarity control bit having high and low logic levels, whereby the logic level of the polarity control bit determines the required polarity of the respective bit of the leading code word in the leading word aligned bit stream which is required for detection purposes.

18. The variable length decoder as set forth in claim 17, wherein each of the AND plane elements which has an AND gate having selectively variable-width inputs further includes a third logic cell which includes:

M inputs coupled to the respective bits of the leading code word in the leading word aligned bit stream which are coupled to the M second logic cells of that AND plane element;

M inputs coupled to the mask control bits which are coupled to the mask control inputs of the M second logic cells of that AND plane element;

V≧0 sub-tree inputs coupled to respective bits of the leading code word of the leading word aligned bit stream; and, wherein the third logic cell finds the location of a leading sub-tree bit and a sign bit of the leading code word in the leading word aligned bit stream.

19. The variable length decoder as set forth in claim 18, wherein each of the AND plane elements which has an AND gate having selectively variable-width inputs further includes a sub-tree justification circuit which forces any redundant bits output by the third logic cell of that AND plane element to a logic low level.

20. The variable length decoder as set forth in claim 19, wherein each of the AND plane elements which has an AND gate having selectively variable-width inputs further includes a low-level address share circuit which is programmable for forcing a group of redundant bits output by the sub-tree justification circuit to a unique value, whereby the group of redundant bits output by the sub-tree justification circuit of all AND plane elements which have an AND gate having variable-width inputs are uniquely coded, to thereby facilitate low-level address page sharing of a code word value memory used for decoding the values of the code words in the input digital data stream.

21. The variable length decoder as set forth in claim 20, wherein each of the AND plane elements which has an AND gate having selectively variable-width inputs further includes a low-level address share programming circuit which receives a plurality of low-level address share bits each having a logic high and a logic low level, for programming the associated low-level address share circuit to produce a plurality V of low-level address bits.

22. The variable length decoder as set forth in claim 21, wherein each of the AND plane elements which has an AND gate having selectively variable-width inputs further includes a sub-tree justification programming circuit which receives a plurality of sub-tree justification bits each having a logic high and a logic low level, for programming the associated sub-tree justification circuit.

23. The variable length decoder as set forth in claim 22, wherein the OR plane includes:
   a plurality of OR gates each having at least one input; and,
   a routing circuit which routs the outputs of the AND gates which are programmed to detect code prefixes which belong to code words having the same bit length to the inputs of the same OR gate.

24. The variable length decoder as set forth in claim 23, wherein the routing circuit is programmable into a plurality of different routing configurations, depending upon which coding standard the input digital data stream is coded in accordance with.

25. The variable length decoder as set forth in claim 24, wherein the OR plane includes an OR plane routing programming circuit which receives a plurality of routing control bits, for programming the routing circuit.

26. The variable length decoder as set forth in claim 25, further including a setup memory which stores and selectively outputs, under the control of the programmable controller, the routing control bits, the mask control bits, the polarity control bits, the sub-tree justification bits, and the low-level address share bits.

27. The variable length decoder as set forth in claim 26, wherein:
   the input digital data stream further includes fixed length code words; and,
   the AND gates of the AND plane include a VLC/FLC control input which receives a VLC/FLC control bit which has a logic high level and a logic low level, whereby the AND gates of the AND plane are enabled or disabled, depending upon the logic level of the VLC/FLC control bit.

28. The variable length decoder as set forth in claim 27, wherein the VLC/FLC control bit is stored and selectively outputted by the setup memory.

29. The variable length decoder as set forth in claim 20, wherein the code word value memory is logically organized into a plurality of individually addressable pages, at least one of which stores a code prefix and a plurality of sub-trees associated with another code prefix, to thereby maximize memory utilization and minimize the required memory size.

30. The variable length decoder as set forth in claim 28, wherein the code word value memory is logically organized into a plurality of individually addressable pages, at least one of which stores a code prefix and a plurality of sub-trees associated with another code prefix, to thereby maximize memory utilization and minimize the required memory size.

31. The variable length decoder as set forth in claim 1, further including a code word value memory used for decoding the values of the code words in the input digital data stream, wherein the code word value memory is logically organized into a plurality of individually addressable pages, at least one of which stores a code prefix and a plurality of sub-trees associated with another code prefix, to thereby maximize memory utilization and minimize the required memory size.

32. The variable length decoder as set forth in claim 3, wherein the controller generates a code type identifier signal which is indicative of the coding standard the input digital data stream is coded in accordance with.

33. The variable length decoder as set forth in claim 32, further including a configuration setup memory which stores configuration control data for each decoding configuration, wherein the configuration control data is selectively read out of the setup memory by the programmable controller for automatically configuring the decoding circuit into the decoding configuration which is appropriate for decoding the input digital data stream.

34. The variable length decoder as set forth in claim 33, wherein the configuration setup memory is responsive to the code type identifier signal for outputting the appropriate configuration data.

35. The variable length decoder as set forth in claim 30, further including an encoder for encoding the outputs of the AND gates of the AND plane from X bits to Y bits, where Y<X.

36. The variable length decoder as set forth in claim 35, further comprising an address share memory which receives the Y bits produced by the encoder and Z code identifier type bits which indicate the type of the leading code word in the leading word aligned bit stream, and employs page sharing to reduce the Y+Z bits to Q bits, where Q<Y+Z, wherein the Q bits constitute high-level address bits, and wherein further, the V low-level address bits produced by the low-level address share circuit in combination with the Q high-level address bits constitute the address information for reading the value of the leading code word in the leading word aligned bit stream from the code word value memory.

37. The variable length decoder as set forth in claim 3, wherein the controller includes a state machine which has a plurality of prescribed initialization states, and is responsive to each of a plurality of hardware reset signals for automatically resetting into a selected one of the prescribed initialization states, depending upon a current state of the state machine.

38. The variable length decoder as set forth in claim 37, further including an invalid data reset signal generating circuit which detects invalid data in the decoding window and generates an invalid data hardware reset signal in response to detection of invalid data.

39. The variable length decoder as set forth in claim 38, wherein the invalid data reset signal generating circuit includes:
   a look-ahead start code detector which detects start codes in the input digital data stream and generates a start code detection signal in response to detection of a start code;
   a boundary cross detector which detects a code word boundary crossing in the input digital data stream and generates a boundary crossing detection signal in response to detection of a boundary crossing; and,
   an AND gate having a first input coupled to the start code detection signal and a second input coupled to the boundary crossing detection signal, wherein the AND gate generates the invalid data hardware reset signal in response to a logic high level of both the start code detection signal and the boundary crossing detection signal.

40. The variable length decoder as set forth in claim 37, wherein the hardware reset signals include an invalid data signal indicative of invalid data in the decoding window, a special code signal indicative of a special code word in the decoding window, and a start signal which signals the start of a decoding sequence.

41. The variable length decoder as set forth in claim 37, further including a special code signal generating circuit which is programmable to detect a selected special code word in the decoding window and to generate a special code hardware reset signal in response to detection of the selected special code word in the decoding window.

42. The variable length decoder as set forth in claim 41, wherein the special code signal generating circuit includes a fully maskable AND gate having inputs coupled to the decoding window.

43. The variable length decoder as set forth in claim 41, wherein the selected special code word can be an escape code or an end of block code.

44. The variable length decoder as set forth in claim 39, further including a special code signal generating circuit which is programmable to detect a selected special code word in the decoding window and to generate a special code hardware reset signal in response to detection of the selected special code word in the decoding window.

45. The variable length decoder as set forth in claim 3, wherein the controller includes a state machine which includes:
   a state machine preprocessor having a first set of inputs coupled to the leading word aligned bit stream, a second set of inputs, and an IDR output which constitutes a one-bit representation of intermediate decoding results;
   a state machine memory having a first address input coupled to the IDR output of the state machine preprocessor, a set of second address inputs, and a plural-bit output which is indicative of a prescribed state of the state machine;
   a state register which has a first set of inputs coupled to the plural-bit output of the state machine memory, and a plural-bit output indicative of a current state of the state machine, wherein the plural-bit output of the state register is coupled to the second address inputs of the state machine memory and to the second set of inputs of the state machine preprocessor; and,
   a state decoder coupled to the plural-bit output of the state machine memory for decoding the plural-bit output of the state machine memory in order to produce a group of control signals for controlling the operation of the variable length decoder.

46. The variable length decoder as set forth in claim 45, wherein the state register further includes at least first and second hardware reset circuits which are coupled to first and second hardware reset signals, respectively, in order to reset the state machine into a first prescribed initialization state in response to a logic high level of the first hardware reset signal, and into a second prescribed initialization state in response to a logic high level of the second hardware reset signal.

47. The variable length decoder as set forth in claim 46, wherein the first hardware reset signal is an invalid data signal indicative of invalid data in the decoding window, an the second hardware reset signal is a start signal which signals the start of a decoding sequence.

48. The variable length decoder as set forth in claim 47, wherein the state register further includes a special initialization logic circuit which has a first input coupled to a special input signal whose logic level is indicative of whether a prescribed special code word is in the decoding window, and a set of second inputs coupled to the plural-bit output of the state register, and wherein further, the special initialization logic circuit forces the state machine into a selected one of a plurality of predetermined states in response to a logic high level of the special input signal, depending upon the current state of the state machine.

49. The variable length decoder as set forth in claim 48, wherein the group of control signals produced by the state decoder includes:
   a VLC code type signal indicative of the code type of the leading code word in the leading word aligned bit stream, when it is a variable-length coded code word;
   a VLC/FLC code type signal indicative of whether the leading code word in the leading word aligned bit stream is a fixed-length code word or a variable-length code word;
   an enable signal for selectively stalling the decoding circuit when more than a single clock cycle is necessary for decoding the leading code word in the leading word aligned bit stream; and,
   a get IDR signal.

50. The variable length decoder as set forth in claim 3, wherein the controller includes a state machine which is operative in a tree-searching decoding mode in response to detection of a prescribed type of code word in the leading word aligned bit stream.

51. The variable length decoder as set forth in claim 49, wherein the state machine preprocessor includes:
   an essentials setup memory having address inputs coupled to the plural-bit output of the state register, and a plurality of outputs, including a plurality of essentials pattern bits, a plurality of essentials mask bits, and a MUX select control bit;
   a plurality J of maskable comparators each of which includes an input coupled to a respective one of the leading J bits of the leading word aligned bit stream, a first set of control inputs coupled to the plurality of essentials pattern bits, a second set of control inputs coupled to the plurality of essentials mask bits, a first output, and a second output;
   an OR gate coupled to the J first outputs of the maskable comparators, and an output;
   an essentials memory which stores decoded essentials data, the essentials memory having J first inputs coupled to the J second outputs of the maskable comparators, a second input coupled to the output of the OR gate, a set of address inputs coupled to corresponding address outputs of the essentials setup memory, and a plural-bit output;
   an essentials shift register having a set of data inputs coupled to the plural-bit output of the essentials memory, a shift input coupled to the get IDR signal output by the state decoder, a stored essentials serial output, and a data output ESR; and,
   an IDR multiplexer having a first input coupled to the output of the OR gate, a second input coupled to the stored essentials serial output of the essentials shift register, a select control input coupled to the get IDR signal output by the state decoder, and an IDR output that constitutes a one-bit representation of the intermediate decoding results.

52. The variable length decoder as set forth in claim 51, wherein each of the maskable comparators includes:
   an XOR gate having a first input coupled to a respective one of a plurality of leading bits of the leading word aligned bit stream, a second input coupled to a respective one of the essentials pattern bits, and an output;

an AND gate having a first input coupled to a respective one of the essentials mask bits, a second input coupled to the output of the XOR gate, and an output which constitutes the first output of the associated maskable comparator; and, a multiplexer having a first input coupled to the respective leading bit of the leading word aligned bit stream, a second input coupled to the respective essentials pattern bit, a select input coupled to the respective MUX select control bit from the essentials setup memory, and an output that consitututes the second output of the associated maskable comparator.

53. A variable length decoder for decoding an input digital data stream which includes a plurality of variable length code words which are coded in accordance with any of a plurality of different coding standards, including:

input means for receiving the input digital data stream and for producing a decoding window that includes a leading word aligned bit stream; and, decoding means which is configurable into any selected one of a plurality of different decoding configurations, depending upon which coding standard the input digital data stream is coded in accordance with, the decoding means being coupled to the leading word aligned bit stream for decoding the length and value of each code word in the input digital data stream.

* * * * *